United States Patent [19]

Nakamura et al.

[11] Patent Number: 5,784,256
[45] Date of Patent: *Jul. 21, 1998

[54] PORTABLE COMPUTER HAVING A CIRCUIT BOARD INCLUDING A HEAT-GENERATING IC CHIP AND A METAL FRAME SUPPORTING THE CIRCUIT BOARD

[75] Inventors: Hiroshi Nakamura; Yuji Nakajima, both of Tokyo, Japan

[73] Assignee: Kabushiki Kaisha Toshiba, Kawaski, Japan

[*] Notice: The term of this patent shall not extend beyond the expiration date of Pat. No. 5,581,443.

[21] Appl. No.: 758,766

[22] Filed: Dec. 3, 1996

Related U.S. Application Data

[63] Continuation-in-part of Ser. No. 523,392, Sep. 5, 1995, Pat. No. 5,581,443.

[30] Foreign Application Priority Data

| Sep. 14, 1994 | [JP] | Japan | 6-220640 |
| Dec. 14, 1994 | [JP] | Japan | 6-310848 |
| May 25, 1995 | [JP] | Japan | 7-126461 |

[51] Int. Cl.$^6$ ........................ H05K 7/20
[52] U.S. Cl. ............... 361/699; 257/712; 361/687
[58] Field of Search ............... 364/708.1; 174/35 R, 174/16.3, 15.2; 62/259.2; 257/706, 712, 715, 723, 724; 165/80.3, 185, 104.33; 361/680, 681, 684, 687, 689, 699, 700, 706, 703–705, 707, 710, 712, 713, 717, 720–722, 816, 818, 728, 784, 785, 789

[56] References Cited

U.S. PATENT DOCUMENTS

| 4,069,497 | 1/1978 | Steidlitz . |
| 4,483,067 | 11/1984 | Parmentier . |
| 4,509,096 | 4/1985 | Baldwin et al. . |
| 4,535,385 | 8/1985 | August et al. . |
| 4,621,304 | 11/1986 | Oogaki et al. . |
| 4,658,331 | 4/1987 | Berg . |
| 4,729,061 | 3/1988 | Brown . |
| 4,731,693 | 3/1988 | Berg et al. . |
| 4,853,828 | 8/1989 | Penn . |
| 4,855,869 | 8/1989 | Tsuji . |
| 4,866,571 | 9/1989 | Butt . |
| 4,924,352 | 5/1990 | Septfons . |
| 4,959,900 | 10/1990 | De Givry et al. . |
| 4,979,074 | 12/1990 | Morley ........................ 361/386 |
| 4,999,740 | 3/1991 | Iiardi et al. . |
| 5,014,904 | 5/1991 | Morton . |
| 5,050,040 | 9/1991 | Gondusky et al. . |
| 5,095,404 | 3/1992 | Chao . |
| 5,109,320 | 4/1992 | Bourdelaise et al. . |
| 5,124,884 | 6/1992 | Yazu et al. . |

(List continued on next page.)

FOREIGN PATENT DOCUMENTS 5-52079  8/1993  Japan .

*Primary Examiner*—Gerald P. Tolin
*Attorney, Agent, or Firm*—Cushman Darby & Cushman IP Group of Pillsbury Madison & Sutro LLP

[57] ABSTRACT

A portable electronic apparatus comprising a housing having a bottom, a metal frame provided in the housing, a circuit board supported by the frame, and an IC chip secured to the circuit board. The circuit board has a first surface extending substantially parallel to the bottom of the housing and a second surface opposing the first surface. The IC chip is adhered to the first surface of the circuit board and generating heat while operating. The apparatus further comprises a metal cover arranged on the first surface of the circuit board and covering the IC chip, and a metal shield plate covering the first surface of the circuit board and the metal cover. The frame has a heat-receiving part which contacts the second surface of the circuit board and which is located near the IC chip. A first thermally conductive elastic sheet is interposed between the cover and the IC chip, and a second thermally conductive elastic sheet is interposed between the cover and the shield plate.

15 Claims, 24 Drawing Sheets

U.S. PATENT DOCUMENTS

| | | |
|---|---|---|
| 5,132,875 | 7/1992 | Plesinger . |
| 5,153,449 | 10/1992 | Crook et al. . |
| 5,161,092 | 11/1992 | Smith .................................... 361/387 |
| 5,172,301 | 12/1992 | Schneider . |
| 5,220,487 | 6/1993 | Patel et al. . |
| 5,237,486 | 8/1993 | Lapointe et al. . |
| 5,251,096 | 10/1993 | Hosoi ...................................... 361/695 |
| 5,262,922 | 11/1993 | Yamaji et al . |
| 5,272,599 | 12/1993 | Koenen . |
| 5,280,409 | 1/1994 | Selna et al. . |
| 5,296,739 | 3/1994 | Heilbronner et al. . |
| 5,305,185 | 4/1994 | Samarov et al. . |
| 5,402,311 | 3/1995 | Nakajima ................................ 361/711 |
| 5,422,788 | 6/1995 | Heinen . |
| 5,430,617 | 7/1995 | Hsu . |
| 5,438,482 | 8/1995 | Nakamura . |
| 5,467,251 | 11/1995 | Katchmer ............................... 361/719 |
| 5,497,296 | 3/1996 | Satou . |
| 5,513,070 | 4/1996 | Xie ......................................... 361/720 |
| 5,557,500 | 9/1996 | Baucom et al. . |
| 5,559,675 | 9/1996 | Hsieh et al. . |
| 5,581,443 | 12/1996 | Nakamura ............................... 361/705 |

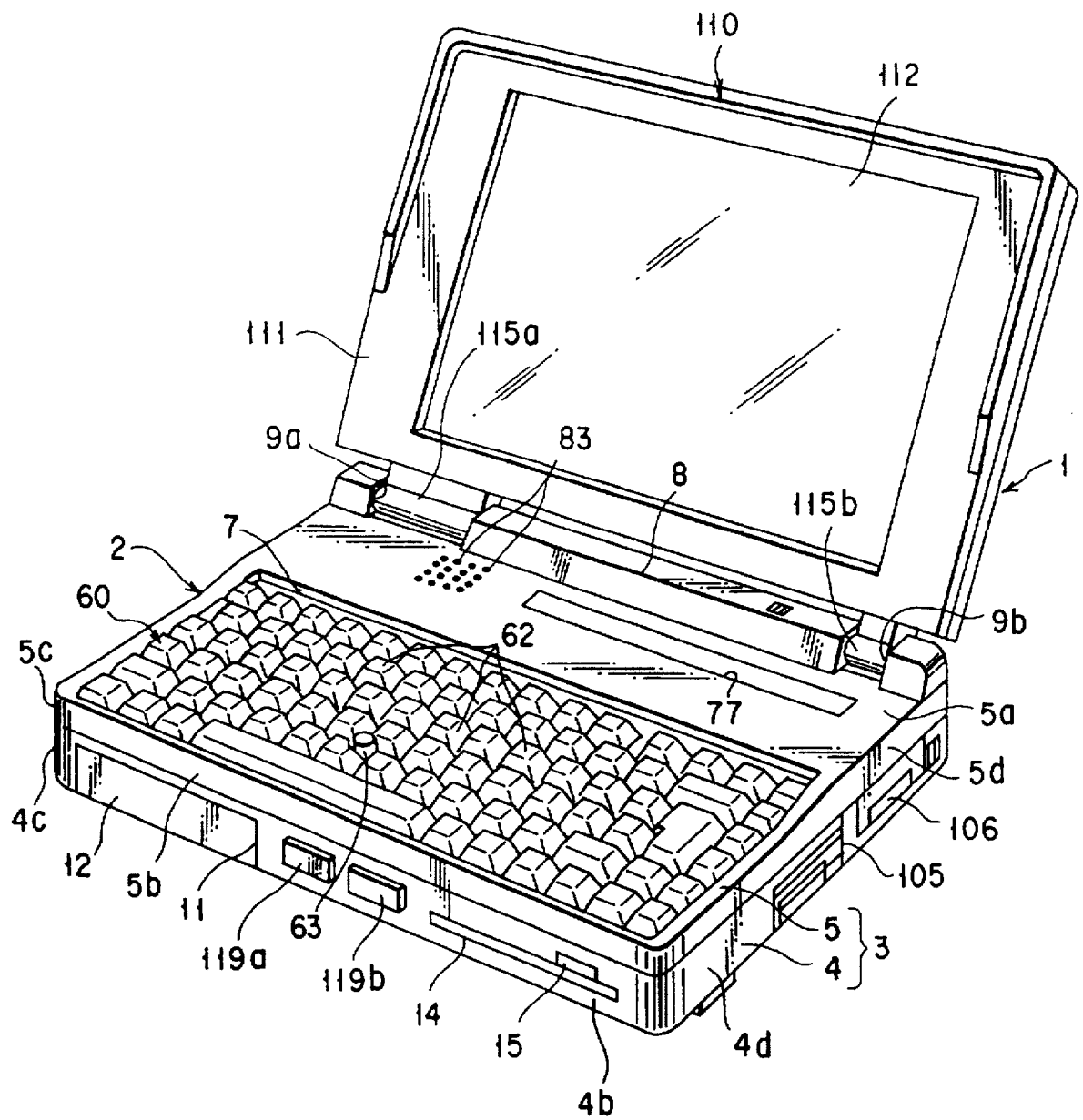
F I G. 1

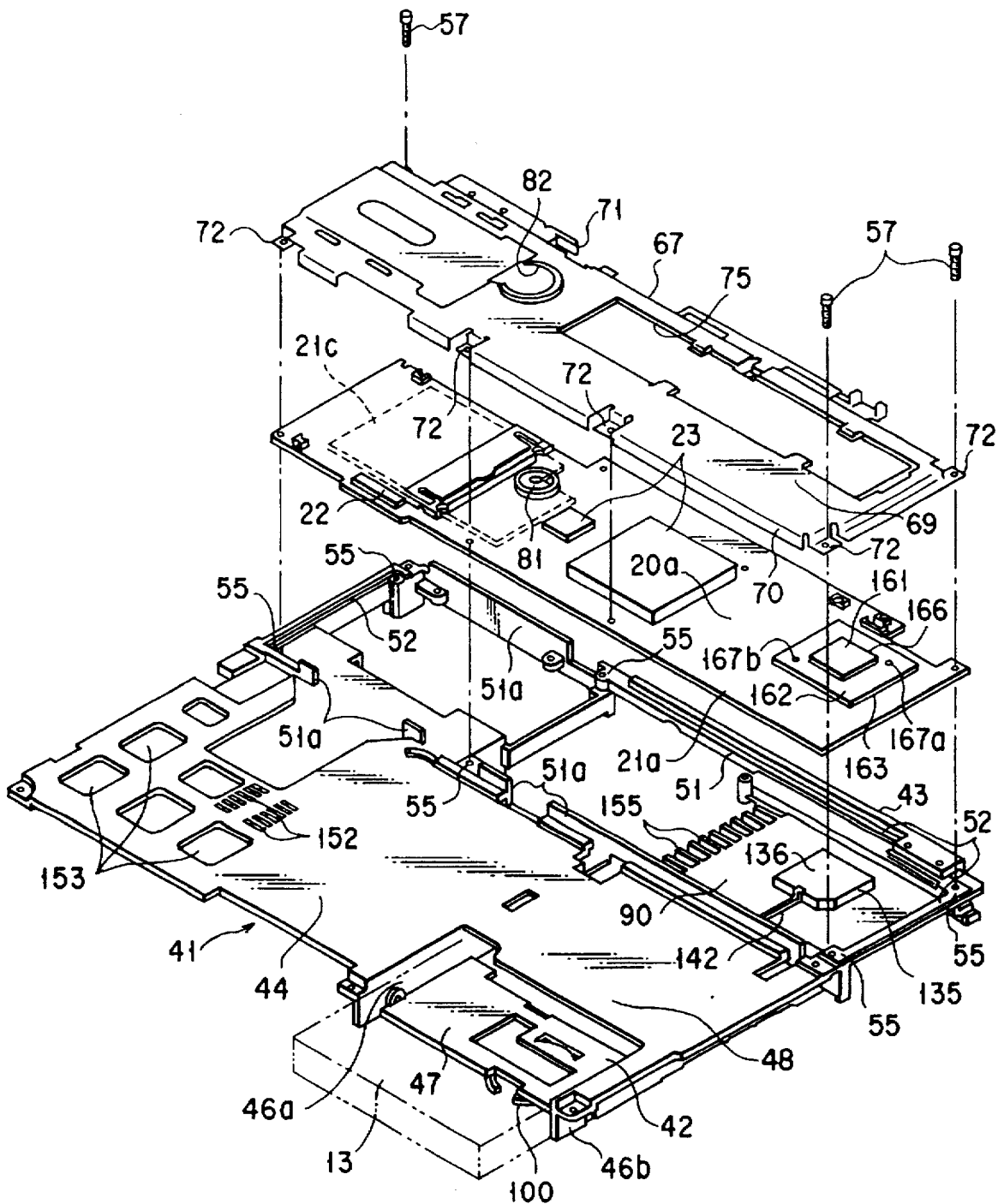
F I G. 3

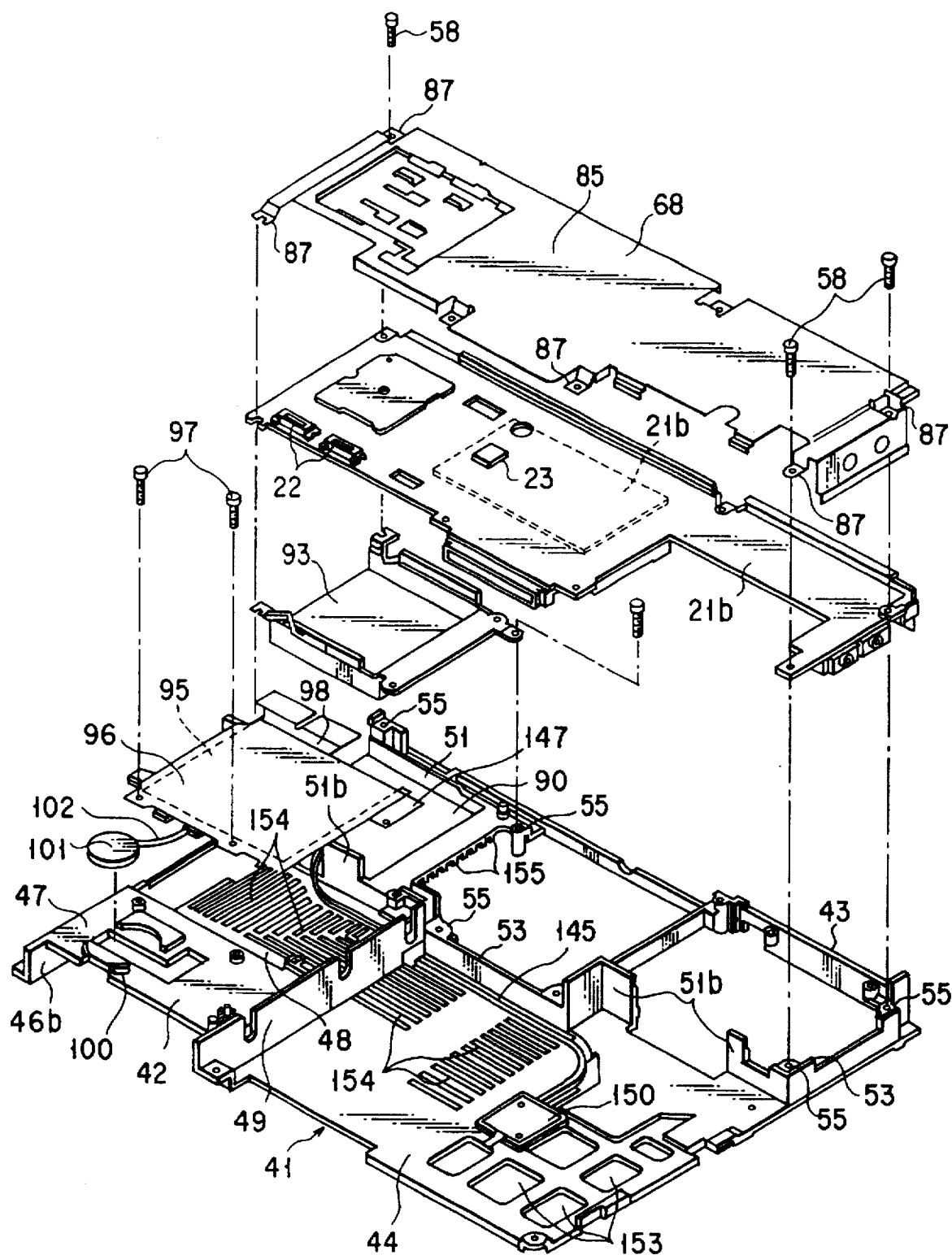
F I G. 4

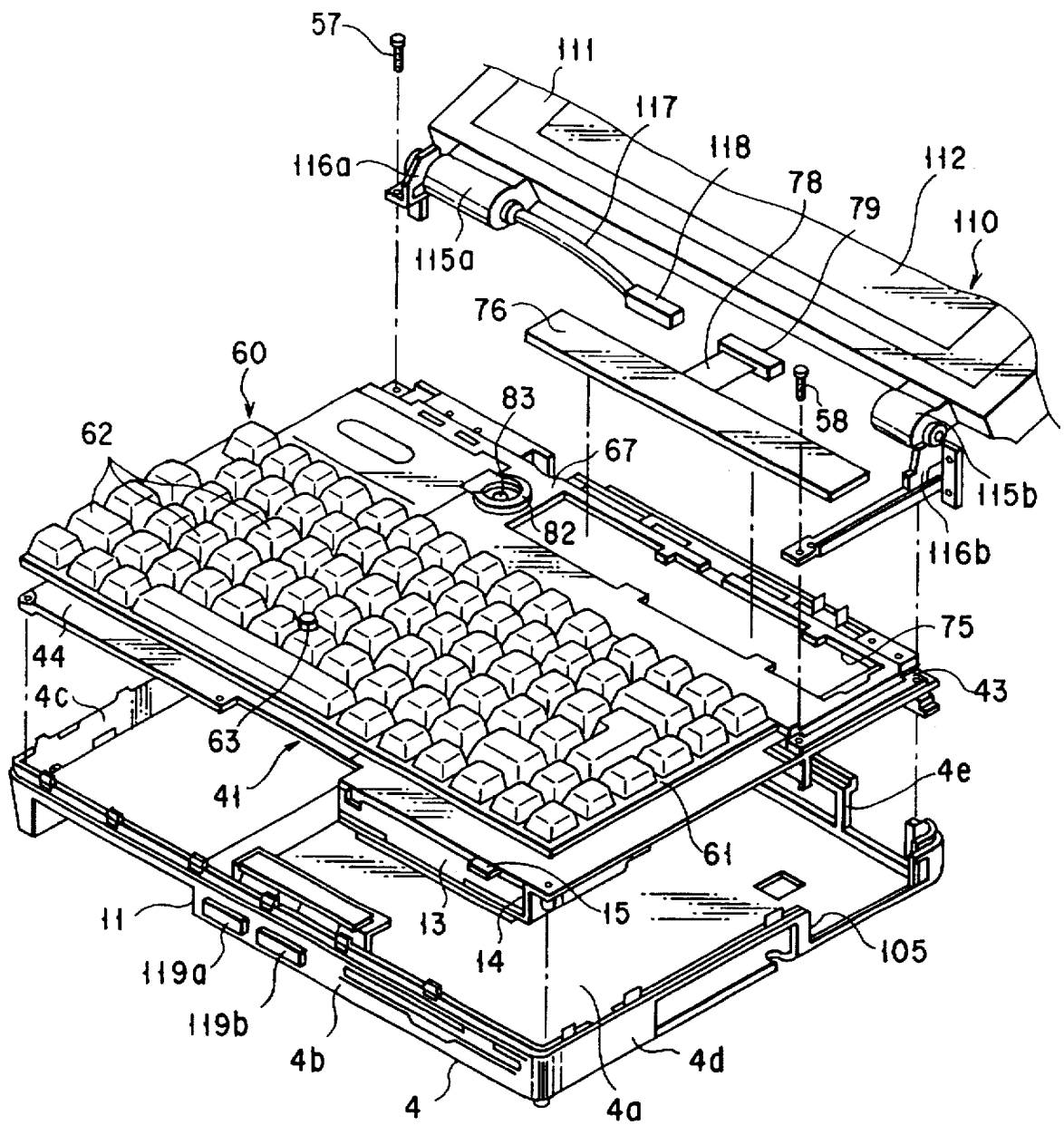
F I G. 10

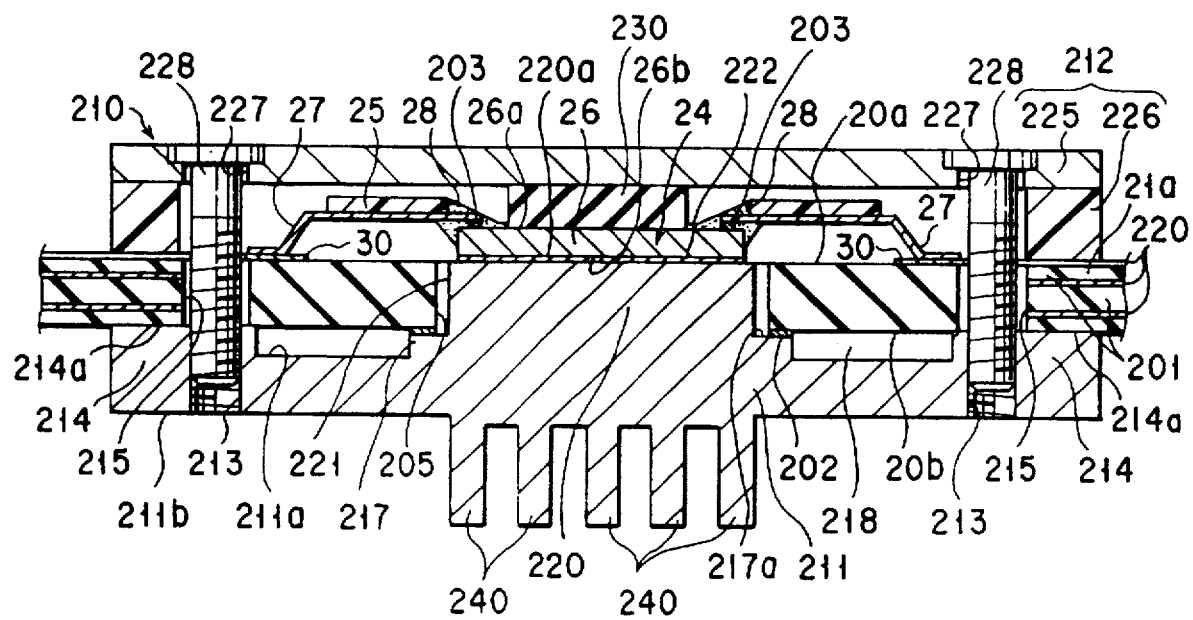
F I G. 21
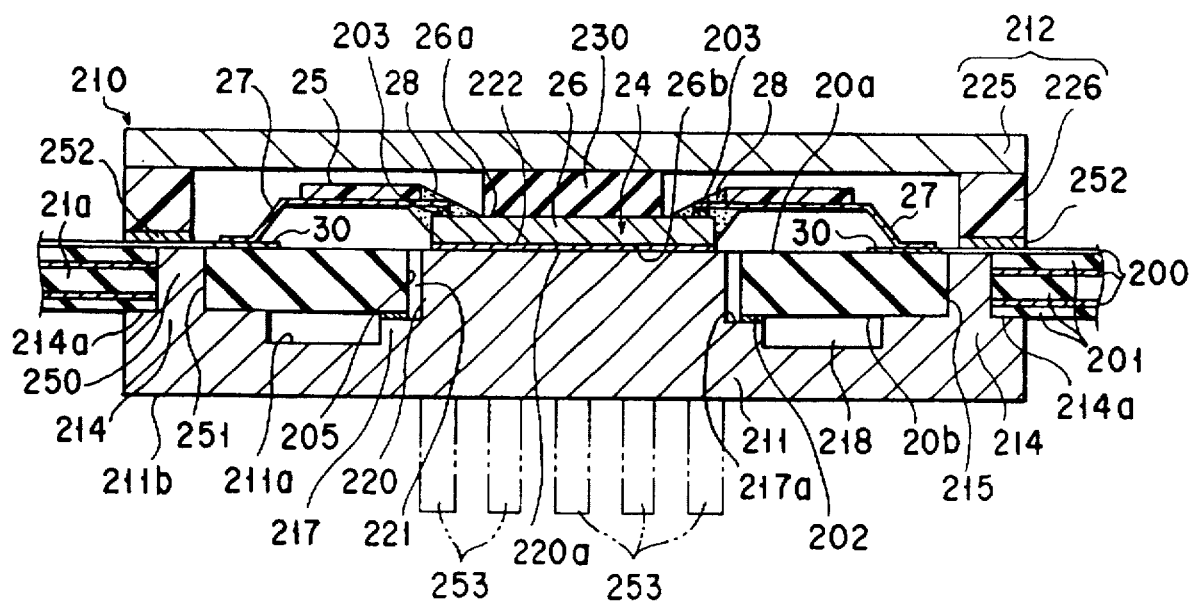
F I G. 22

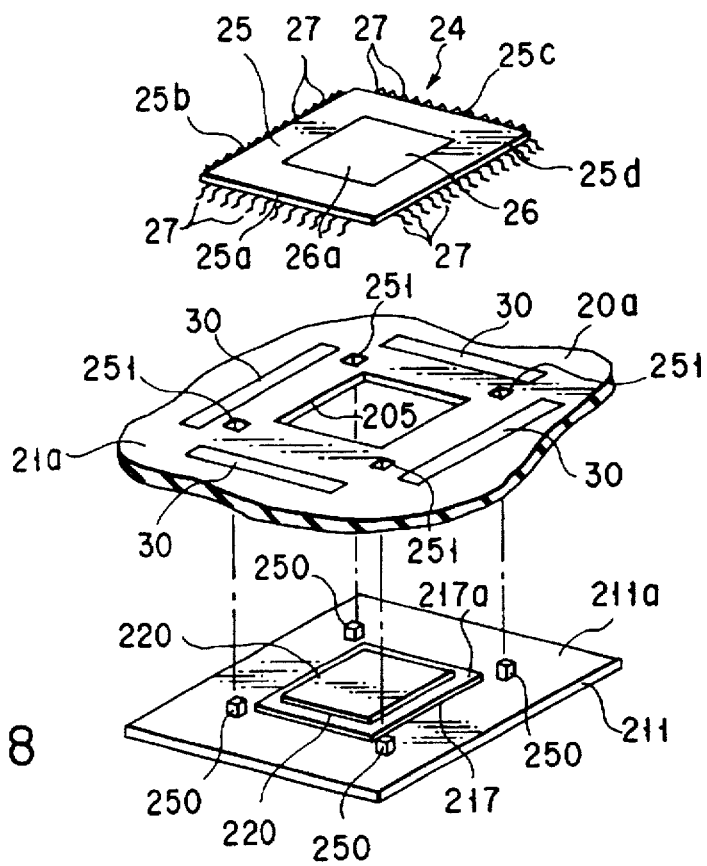
F I G. 28
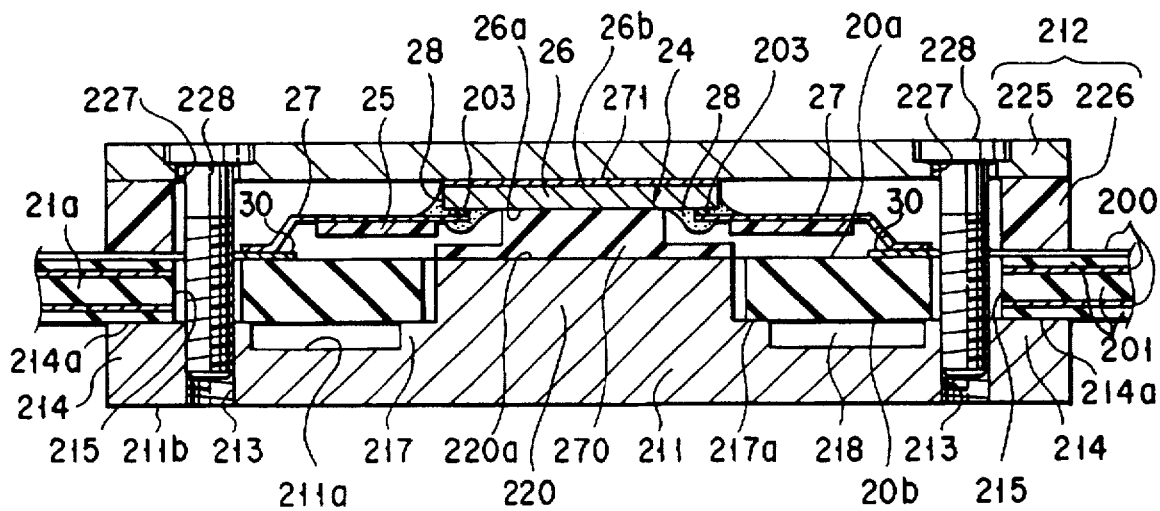
F I G. 29

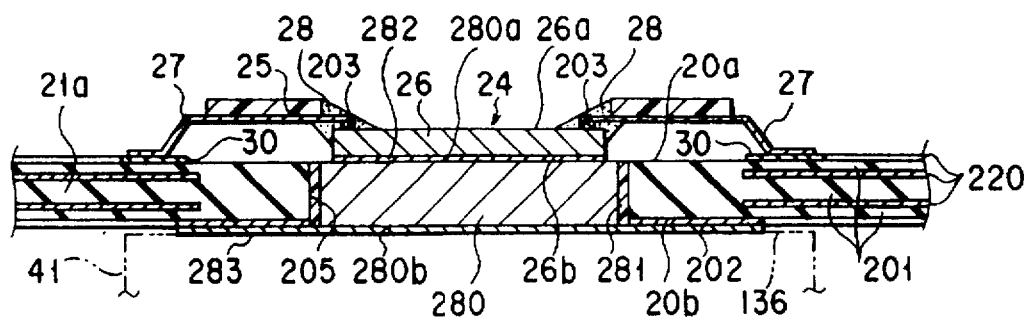
F I G. 30
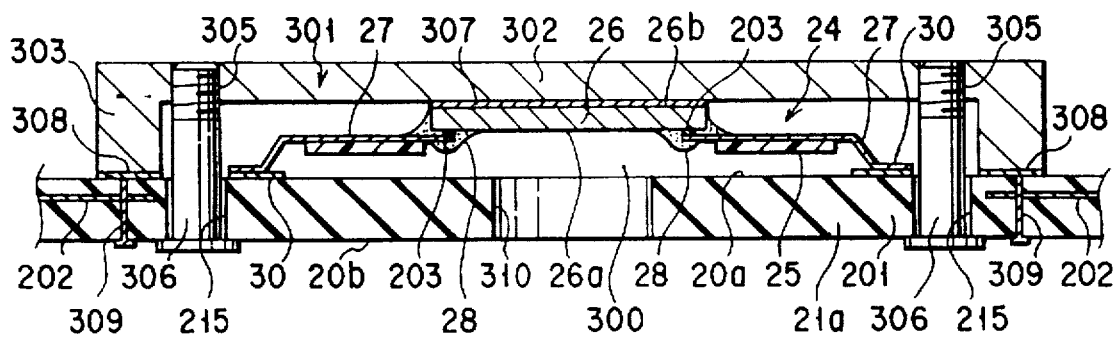
F I G. 31
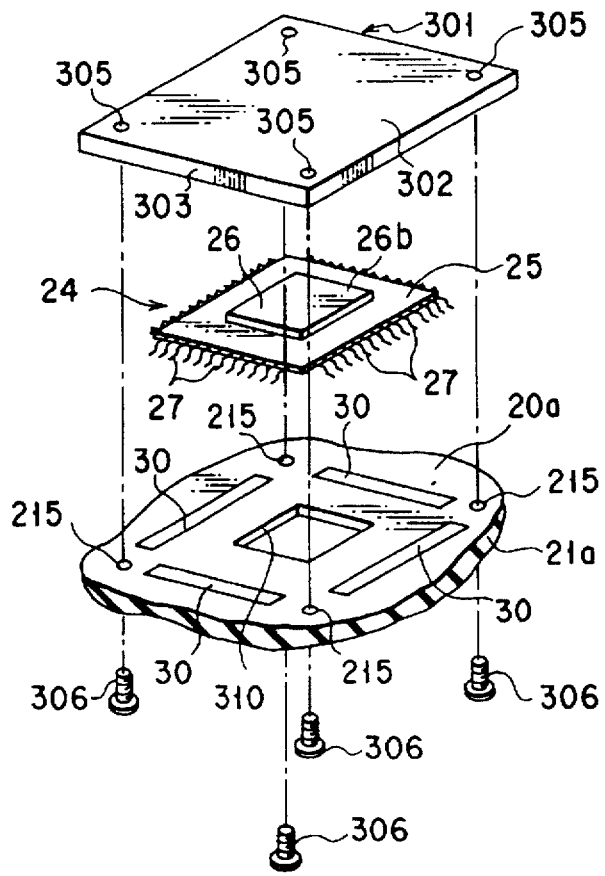
F I G. 32

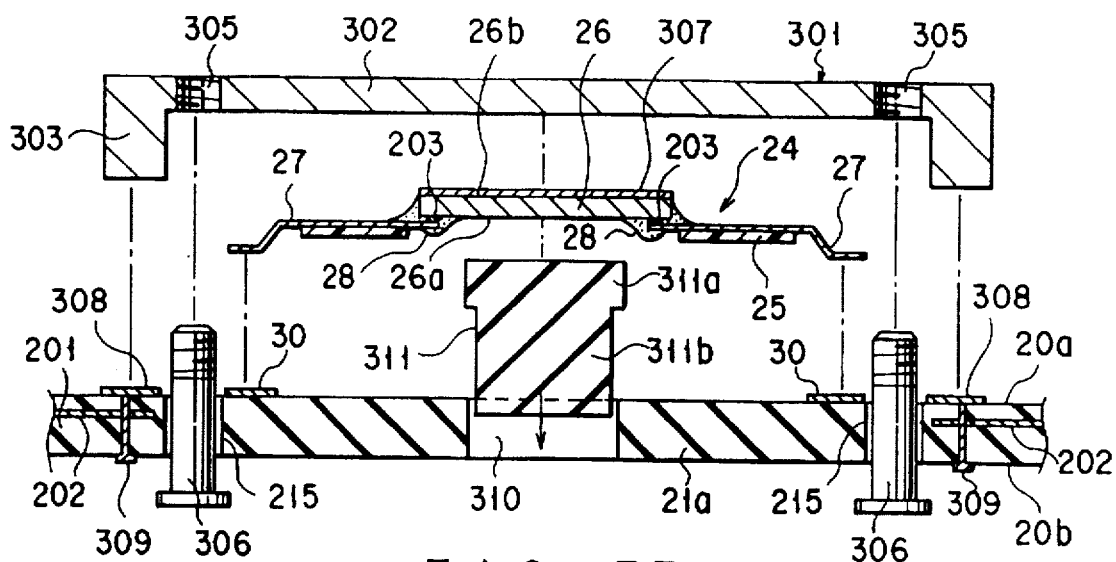
F I G. 33
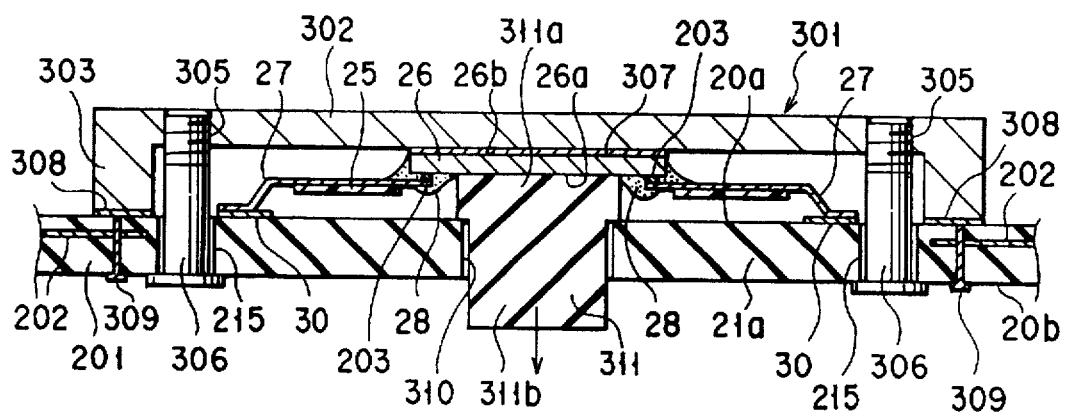
F I G. 34
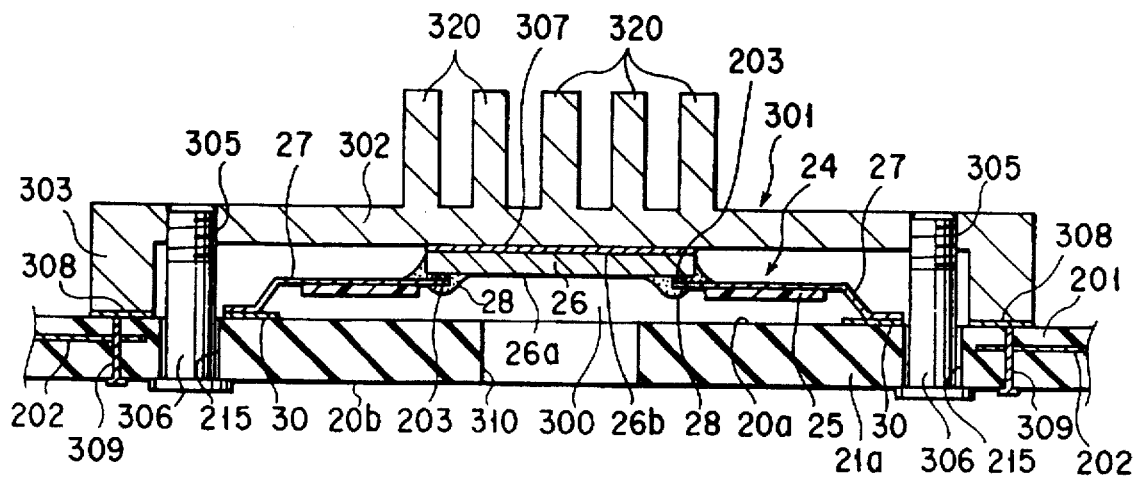
F I G. 35

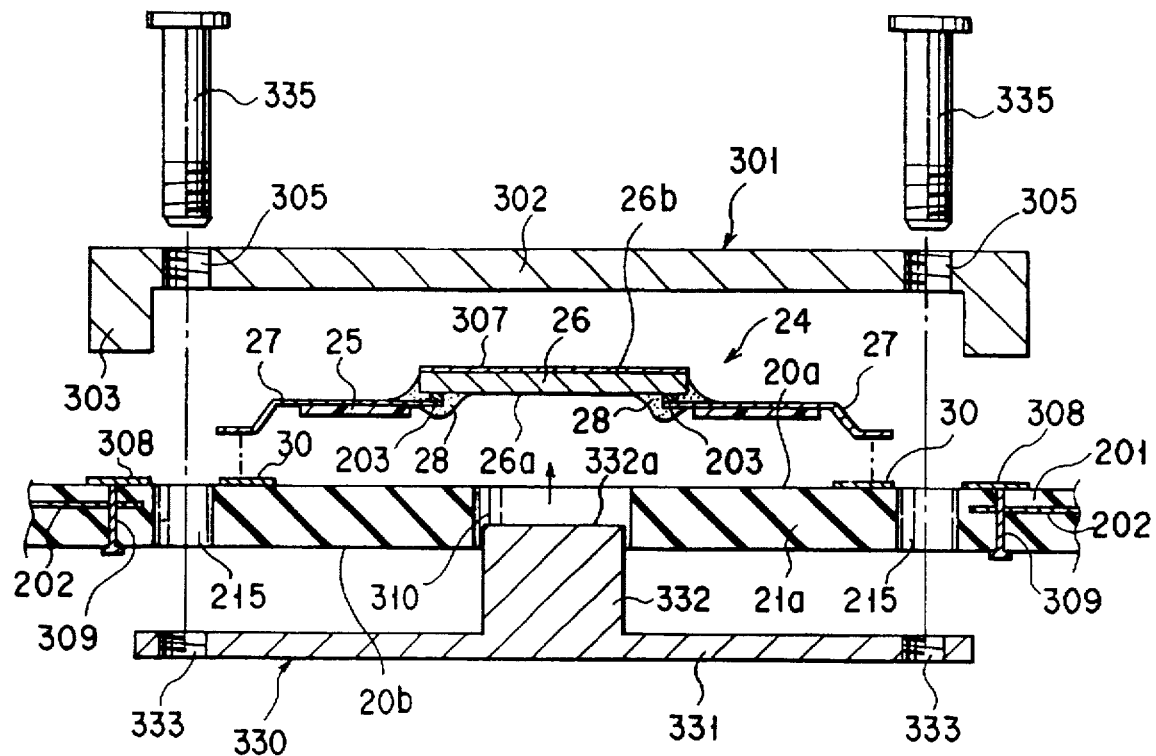
F I G. 36
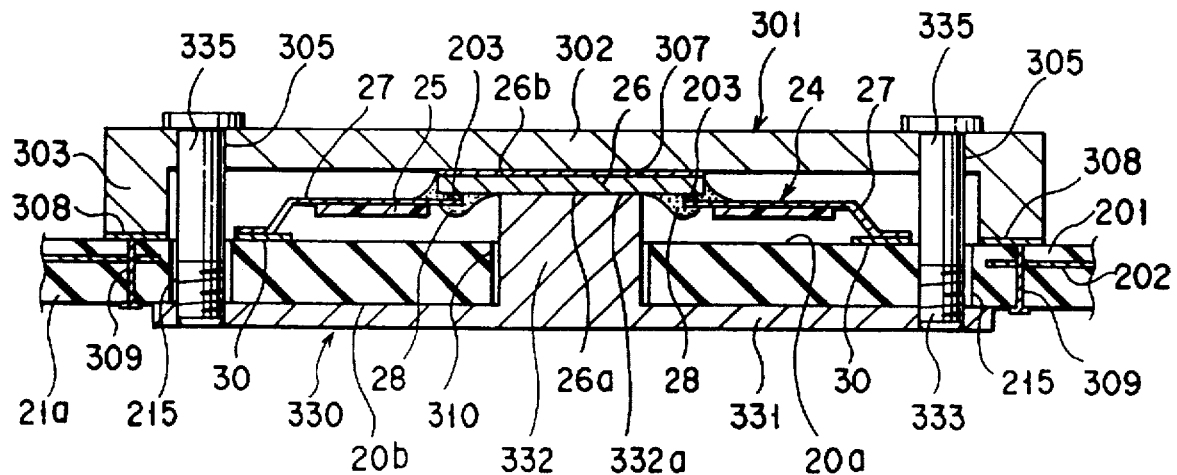
F I G. 37

PORTABLE COMPUTER HAVING A CIRCUIT BOARD INCLUDING A HEAT-GENERATING IC CHIP AND A METAL FRAME SUPPORTING THE CIRCUIT BOARD

This is a division of application Ser. No. 08/523,392, filed Sep. 5, 1995, now U.S. Pat. No. 5,581,443.

BACKGROUND OF THE INVENTION

1. Field of the Invention

The present invention relates to a portable electronic apparatus such as a portable computer, which has a circuit board having a TCP (Tape Carrier Package) mounted on it, and more particularly to a structure for dissipating heat from the TCP.

2. Description of the Related Art

Book-type and notebook-type portable computers recently developed are made increasingly compact and capable of performing more and more functions. Each portable computer comprises a circuit board and an LSI package. The LSI package is mounted on the circuit board. It has an increased data-storage capacity and can perform many functions. Inevitably it has a large chip size and many pins. The larger the LSI package, the greater area it occupies on the circuit board. To decrease this area without reducing the number of pins, it would be necessary to minimize the lead pitch of the LSI package.

Known as LSI packages which are relatively small and yet has many pins are a PGA (Pin Grid Array) and a QFP (Quad Flat Package). If these LSI packages have a large chip size and many pins, however, they will be no longer small enough to be incorporated into multi-function portable computers.

An LSI package which has many pins and which is compact nonetheless is now attracting attention. This is a TCP (Tape Carrier Package). A TCP comprises a resin film, a number of leads provided on the film, and an IC chip mounted on the film. The leads have their end portions extending from the edges of the resin film. They have their ends soldered to the pads which is provided on the circuit board.

The IC chip of the TCP is exposed outside a resin molding, not embedded within the molding. The TCP is therefore mechanically less strong than the PGA. Since the TCP is mechanically fragile, a heatsink having a number of heat-radiating fins can hardly be attached to the TCP to absorb a great amount of heat which the TCP generates while operating. It is therefore necessary to dissipate heat from the any TCP incorporated into a computer.

There are know some methods of dissipating heat from a TCP used in a computer. One of them is to provide an electric fan in the housing of the computer, for cooling the TCP. The use of the electric fan is disadvantageous in some respects. First, the housing needs to be large enough to accommodate it, inevitably making the computer less compact. Second, the electric fan makes much noise while operating. Third, the manufacturing cost of the computer increases. Fourth, the fan consumes much power, greatly increasing the power consumption of the computer, and the operating time of the computer will be short if the computer is a battery-driven one.

Another known method of dissipating heat from the TCP used in a computer is to adhere the IC chip to the circuit board, causing the heat to propagate to the circuit board from the the TCP including the IC chip. This method cannot dissipate the heat effectively from the circuit board, because the circuit board has but a limited size. The heat from the TCP accumulate in the circuit board, heating the circuit board to a high temperature. As the circuit board is heated, the components mounted on the circuit board together with the TCP (e.g., LSI packages and circuit components) are inevitably heated. When excessively heated, the components may malfunction.

As regards technique of dissipating heat from an IC chip, Jpn. Pat. Appln. KOKAI Publication No. 5-52079 discloses an electronic device which has an IC chip and which is mounted on a circuit board. The circuit board has a through hole which is relatively large and whose inner surface is plated. A heat-radiating plate is provided on the lower surface of the circuit board, with a projection inserted in the through hole of the circuit board. The projection is made of good thermal conductivity, such as copper or brass. The projection contacts the electronic device. Hence, the electronic device generates while operating propagates into the heat-radiating plate through the projection. This technique of dissipating heat from an IC chip has the following drawbacks, however.

The projection of the heat-radiating plate contacts the layer plated on the inner surface of the through hole. The heat transmitted from the electronic device to the projection is therefore dissipated to the circuit board through the plated layer. The heat is readily transferred to the circuit board because the hole is much smaller than the device and also because the device is connected to the circuit board by a layer of solder or thermal compound. The heat affects the circuit board very much.

Furthermore, since the through hole is much smaller than the electronic device, the contacting area of the device and the projection is small. Heat cannot be transferred with high efficiency from the device to the projection. The electronic device cannot radiate heat sufficiently, though a heat-transmitting path extends from the device to the heat-radiating plate.

SUMMARY OF THE INVENTION

The first object of the present invention is to provide a portable electronic apparatus which has a circuit board and a TCP mounted on the board and in which heat is efficiently dissipate from the TCP through a shield plate covering the board, without assistance of an electric fan or a heatsink.

The second object of the invention is to provide a heat-dissipating device for use in a circuit module having a circuit board and an IC chip, which can dissipate heat from the IC chip outwards with high efficiency, without transmitting the heat to the circuit board.

To achieve the first object, there is provided a portable electronic apparatus which comprises: a housing having a bottom; a metal frame provided in the housing; a circuit board supported by the frame and provided in the housing, and having a first surface extending substantially parallel to the bottom of the housing and a second surface opposing the first surface; an IC chip adhered to the first surface of the circuit board and generating heat while operating; a metal cover arranged on the first surface of the circuit board and covering the IC chip; and a metal shield plate covering the first surface of the circuit board and the metal cover.

The frame has a heat-receiving part which contacts the second surface of the circuit board and which is located near the IC chip. A first elastic sheet is interposed between the cover and the IC chip. A second elastic sheet is interposed between the cover and the shield plate. Both elastic sheets is thermally conductive.

The heat the IC chip generates while operating is first dissipated to the circuit board. The heat is then transmitted from the board to the heat-receiving part of the frame. This is because the heat-receiving part contacts the second surface of the circuit board and is located near the IC chip. The heat is dissipated from the heat-receiving part to any other part of the frame since the frame is made of a metal which is good heat conductor. The heat would not accumulate in a particular part of the frame.

Moreover, the heat is transmitted from the IC chip to the cover through the first elastic sheet, and hence to the metal shield plate through the second elastic sheet. Thus, the heat the IC chip generates is dissipated to both the frame and the shield plate.

To achieve the second object, there is provided a heat-dissipating device for use in a circuit module, which comprises: an IC chip which generates heat while operating and which has a first chip surface, a second chip surface facing away from the first chip surface, and terminals arranged on the first chip surface; a circuit board having pads connected to the IC chip, a first surface facing the second chip surface of the IC chip, a second surface facing away from the first surface, and a hole made in a portion facing the IC chip and larger than the IC chip; a thermally conductive heat-radiating member spaced apart from the second surface of the circuit board, providing a first gap; a projection formed integral with the heat-radiating member, inserted in the hole, providing a second gap, having a contacting surface larger than the second chip surface of the IC chip and contacting the second chip surface; a cover arranged on the first surface of the circuit board and covering the IC chip; an elastic member made of rubber-like material, arranged between the cover and the first chip surface of the IC chip, and capable of being deformed elastically; and a connecting member connecting the cover and the heat-radiating member together and holding the IC chip between the elastic member and the contacting surface of the projection.

The IC chip is mounted on the circuit board, with its first chip surface facing away from the circuit board. The heat the IC chip generates while operating is dissipated from the second chip surface of the IC chip to the heat-radiating member through the projection. Having no parts of terminals mounted on it, the second chip surface of the IC chip can serve, in its entirety, to dissipate the heat from the IC chip. Larger than the second chip surface of the IC chip, the contacting surface of the projection can serve, in its entirety, to dissipate the heat from the IC chip.

Since the IC chip is held between the projection and the elastic member, it remains in tight contact with the projection. Heat can therefore be efficiently transmitted from the IC chip to the heat-radiating member.

Further, the air in the first gap between the heat-radiating member and the circuit board and the second gap between the projection and the hole of the circuit board function as adiabatic layers. The heat transmitted from the IC chip to the projection and the heat-radiating member can hardly propagate to the circuit board. The circuit board is thereby prevented from being heated excessively.

To achieve the second object, too, there is provided a heat-dissipating device which comprises: an IC chip which generates heat while operating and which has a first chip surface, a second chip surface facing away from the first chip surface, and terminals arranged on the first chip surface; a circuit board having pads connected to the IC chip, a first surface facing the second chip surface of the IC chip, a second surface facing away from the first surface, a hole made in a portion facing the IC chip and larger than the IC chip, and a plurality of leg-holding holes surrounding the hole; a thermally conductive heat-radiating member spaced apart from the second surface of the circuit board, providing a first gap; a projection formed integral with the heat-radiating member, inserted in the hole, providing a second gap, having a contacting surface larger than the second chip surface of the IC chip and contacting the second chip surface; and a plurality of legs formed integral with the heat-radiating member and force-fitted in the leg-holding holes.

Since the legs formed, integral with the heat-radiating member are force-fitted in the leg-holding holes of the circuit board, the heat-radiating member is secured to the circuit board. No means, such as screws, need to be used to fasten the heat-radiating member to the circuit board.

The IC chip is mounted on the circuit board, with its first chip surface facing away from the circuit board. The terminals are arranged on the first chip surface of the IC chip, not on the second chip surface thereof. Hence, as long as the heat-radiating member remains secured to the circuit board, the projection contacts the second chip surface of the IC chip. The heat the IC chip generates while operating is dissipated from the second chip surface of the IC chip to the heat-radiating member through the projection. Having no parts of terminals mounted on it, the second chip surface of the IC chip can serve, as a whole, to dissipate the heat from the IC chip. Larger than the second chip surface of the IC chip, the contacting surface of the projection can serve, in its entirety, to dissipate the heat from the IC chip.

Further, the air in the first gap between the heat-radiating member and the circuit board and the second gap between the projection and the hole of the circuit board function as adiabatic layers. The heat transmitted from the IC chip to the projection and the heat-radiating member can hardly propagate to the circuit board. The circuit board is thereby prevented from being heated excessively.

To achieve the second object, too, there is provided a heat-dissipating device which comprises: an IC chip which generates heat while operating and which has a first chip surface, a second chip surface facing away from the first chip surface, and terminals arranged on the first chip surface; a circuit board having a chip-mounting surface facing the first chip surface of the IC chip, a pad mounted on the chip-mounting surface, and a through hole made in a portion facing the IC chip; a thermally conductive heat-radiating member arranged on the chip-mounting surface of the circuit board and covering the IC chip; a layer of thermally conductive adhesive connecting the heat-radiation member to the second chip surface of the IC chip; and a holding member interposed between the IC chip and the chip-mounting surface of the circuit board, pressing the IC chip toward the heat-radiating member until the layer of thermally conductive adhesive hardens, and designed to be removed from a gap between the IC chip and the chip-mounting surface via the through hole after the adhesive hardens.

The IC chip is mounted on the circuit board, with its first chip surface facing away from the circuit board. The terminals are arranged on the first chip surface of the IC chip, not on the second chip surface thereof. Thus, the heat the IC chip generates while operating is dissipated from the second chip surface of the IC chip to the heat-radiating member. Since the adhesive layer is provided between the second chip surface of the IC chip and the heat-radiating member, no gap is made between them to prevent transmission of heat from the IC chip to the heat-radiating member. The heat is therefore efficiently dissipated from the IC chip. A heat-radiating path is provided on that side of the IC chip which faces away from the circuit board.

Once the IC chip is mounted on the circuit board, the terminals faces the chip-mounting surface of the circuit board. Due to the presence of the terminals, a gap is formed between the first chip surface of the IC chip and the chip-mounting surface of the circuit board. Until the adhesive layer hardens, the IC chip is likely to peel off the heat-radiating member or to move with respect to the heat-radiating member. Thus, the IC chip may take a position different from the desired one. Nonetheless, the IC chip take the desired position since the holding member is provided between the IC chip and the chip-mounting surface, pressing the IC chip toward the heat-radiating member, until the adhesive layer hardens. Positioned desirably, the IC chip is reliably adhered to the heat-radiating member. The heat can therefore transmitted to the heat-radiating member.

After the adhesive layer is hardens, the holding member is removed via the through hole, forming a gap between the circuit board and the first chip surface of the IC chip. This gap functions as an adiabatic layer, making it hard for the heat radiating from the IC chip to reach the circuit board.

Furthermore, the heat radiating from the IC chip can be dissipated outside through the through hole of the circuit board since the hole communicates with the gap between the circuit board and the IC chip. Hence, heat hardly accumulates at the interface between the circuit board and the heat-radiating member. Because of this, and because of the fact that gap works as an adiabatic layer, the influence of heat on the circuit board can be minimize.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view of a portable computer which is a first embodiment of the invention;

FIG. 3 is an exploded perspective view of some components of the first embodiment, explaining how the first circuit board, the first shield plate and the FDD are incorporated into the frame;

FIG. 4 is an exploded perspective view of some components of the first embodiment, explaining how the second circuit board, the second shield plate and the extension circuit board are incorporated into the frame positioned upside down;

FIG. 10 is an exploded perspective view of some components of the first embodiment, explaining how the keyboard device, the display unit, and the frame containing the circuit boards and the FDD are incorporated into the lower housing half;

FIG. 21 is a sectional view, showing that part of a portable computer according to a fourth embodiment, to which a TCP is fastened;

FIG. 22 is a sectional view, showing that part of a portable computer according to a fifth embodiment, to which a TCP is fastened;

FIG. 28 is an exploded perspective view, showing the circuit board, TCP and radiator of the seventh embodiment;

FIG. 29 is a sectional view, showing that part of a portable computer according to an eighth embodiment, to which a TCP is fastened;

FIG. 30 is a sectional view, showing that part of a portable computer according to a ninth embodiment, to which a TCP is fastened;

FIG. 31 is a sectional view, showing that part of a portable computer according to a tenth embodiment, to which a TCP is fastened;

FIG. 32 is an exploded perspective view, showing the circuit board, TCP and radiator of the tenth embodiment;

FIG. 33 is an exploded sectional view, showing the circuit board, TCP, pushing member and heat-radiating member of the tenth embodiment;

FIG. 34 is a sectional view of the tenth embodiment, showing the IC chip of the TCP pressed onto the holding member which contacts the heat-radiating member;

FIG. 35 is a sectional view, showing that part of a portable computer according to an eleventh embodiment, to which a TCP is fastened;

FIG. 36 is an exploded sectional view, showing the circuit board, TCP, pushing member and heat-radiating member of a twelfth embodiment;

FIG. 37 is a sectional view of the twelfth embodiment, showing the IC chip of the TCP pressed onto the holding member which contacts the heat-radiating member;

DETAILED DESCRIPTION OF THE PREFERRED EMBODIMENTS

Figure 2:
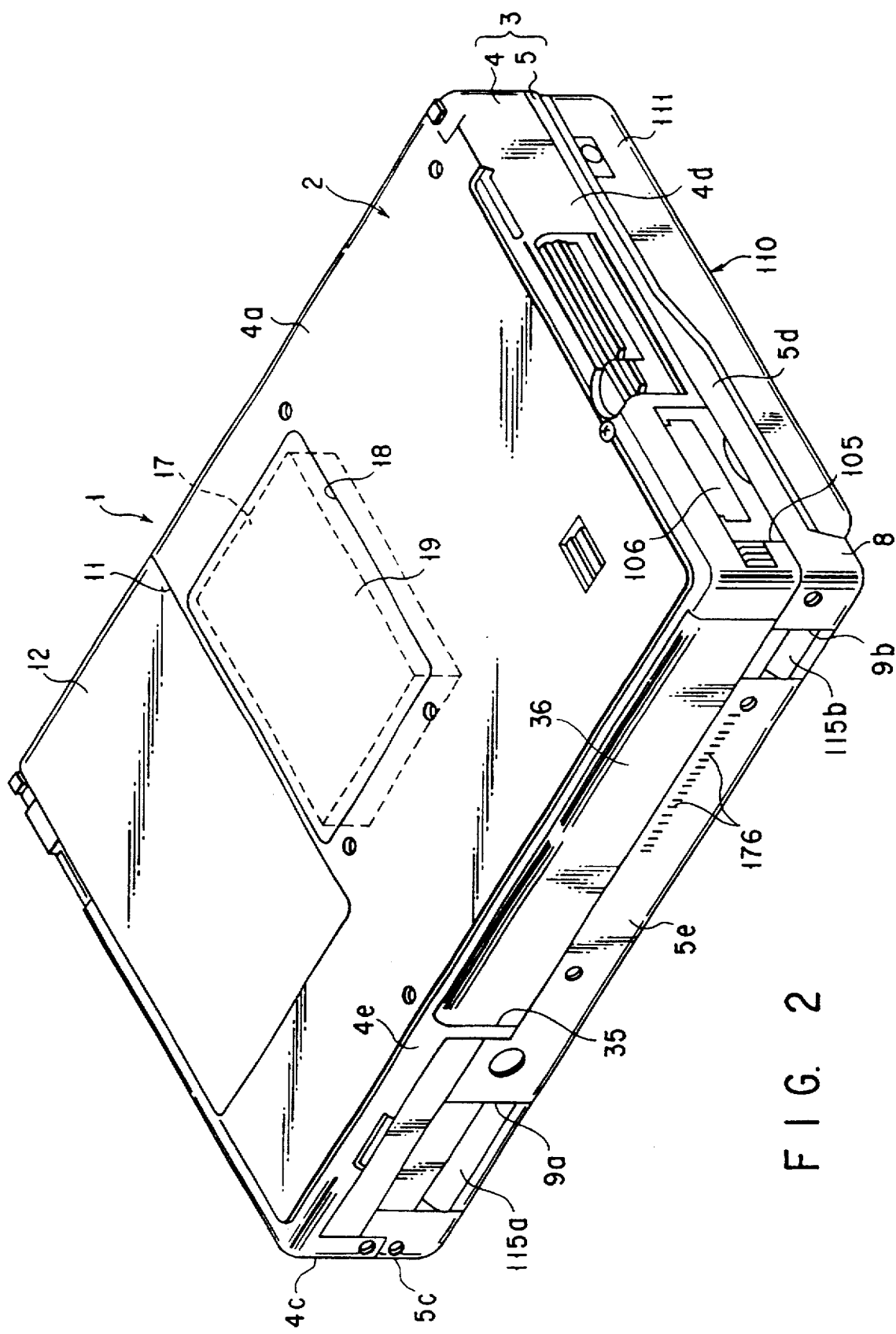
FIG. 2 is a perspective view of the portable computer of the first embodiment, positioned upside down.

A book-type portable computer, which is the first embodiment of the present invention, will be described with reference to FIGS. 1 to 14.

FIG. 1 is a perspective view of the portable computer 1 which has the size of an A4 paper sheet. The computer 1 comprises a main body 2. The main body 2 has a rectangular, box-shaped housing 3. The housing 3 consists of a lower housing half 4 and an upper housing half 5, which are made of a synthetic resin such as ABS (Acrylonitrile Butadiene Styrene) resin.

As shown in FIG. 2, the lower housing half 4 comprises a rectangular bottom wall 4a and four side walls 4b, 4c, 4d and 4e. The side walls 4b to 4e are formed integral with the bottom wall 4a. The upper housing half 5 comprises a rectangular top wall 5a and four side walls 5b, 5c, 5d and 5e. The side walls 5b to 5e are formed integral with the top wall 5a. The bottom wall 4a and the top wall 5a oppose each other and extend parallel to each other. The side walls 5b to 5e of the upper housing half 5 are aligned with the side walls 4b to 4e of the lower housing half 4. The side walls 4b to 4e and the side walls 5b to 5e constitute the front, back, left side and right side of the housing 3.

As shown in FIG. 1, the top wall 5a of the upper housing half 5 has a rectangular opening 7 in its front half part, for accommodating a keyboard 60. The top wall 5a also has a hollow projection 8 on its rear end portion. The projection 8 extends in the widthwise direction of the upper housing half 5. The projection 8 has a pair of leg-holding recesses 9a and 9b, which are spaced apart in the widthwise direction of the upper housing half 5.

The housing 5 has a battery receptacle 11 in the front-left corner of the lower housing half 4. The receptacle 11 opens at the front and bottom of the lower housing half 4. Removably fitted in the receptacle 11 is a battery pack 12 which supplies power when the computer 1 is used in a place where no commercial power source is available. The battery pack 12 can be removed from the receptacle 11 from the front of the housing 3.

As illustrated in FIG. 10, the housing 3 contains a floppy disk drive 13 (hereinafter referred to as "FDD 13"). The FDD 13 is provided in the front-right corner of the housing 3. The FDD 13 has a disk slot 14 and an eject button 15, both in the front. Through the slot 14 a floppy disk can be inserted into and removed from the interior of the FDD 13. The eject button 15 is pushed to eject a floppy disk from the interior of the FDD 13.

As shown in FIG. 2, the housing 3 contains a hard disk drive 17 (hereinafter referred to as "HDD 17"). The HDD 17 is located between the battery receptacle 11 and the FDD 13. The HDD 17 can be removed from the housing 3 through a HDD hole 18 which is made in the bottom wall 4a of the lower housing half 4. The HDD hole 18 is closed by a removable HDD cover 19.

As seen from FIGS. 3 and 4, the housing 3 contains four circuit boards 21a to 21d. The circuit boards 21a to 21d are arranged at the back of the battery pack 12, the FDD 13 and HDD 17. They are stacked and spaced from another, in the height direction of the lower housing half 4.

The first circuit board 21a and the second circuit board 21b are rectangular, each having a width almost equal to the width of the lower housing half 4. The first circuit board 21a is a system board and located above the second circuit board 21b. Its upper surface (first surface) 20a and its lower surface (second surface) 20b extend substantially parallel to each other. Connectors 22 and QFPs (Quad Flat Packages) 23 (i.e., LSI packages) are mounted on both surfaces 20a and 20b of the first circuit board 21a. A TCP (Tape Carrier Package) 24 is mounted on the right-end part of the upper surface 20a. The TCP 24 generates a great amount of heat while operating, because the computer 1 has many functions and processes a large amount of data at high speed.

Figure 12A:
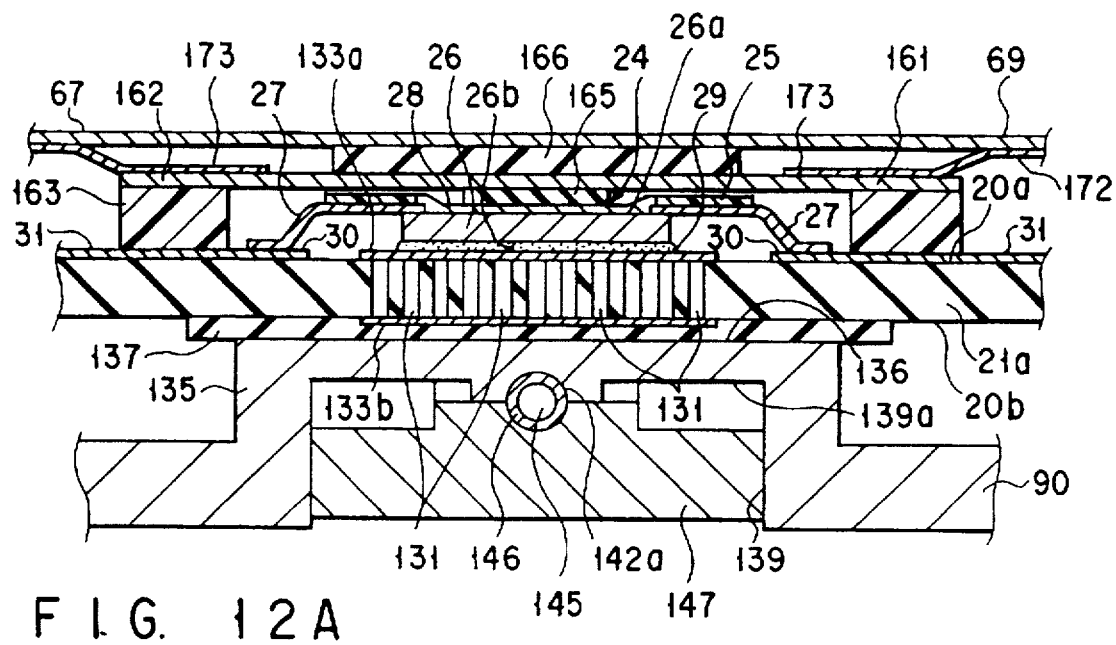
FIG. 12A is a sectional view of that part of the first embodiment to which a TCP is fastened.
Figure 13:
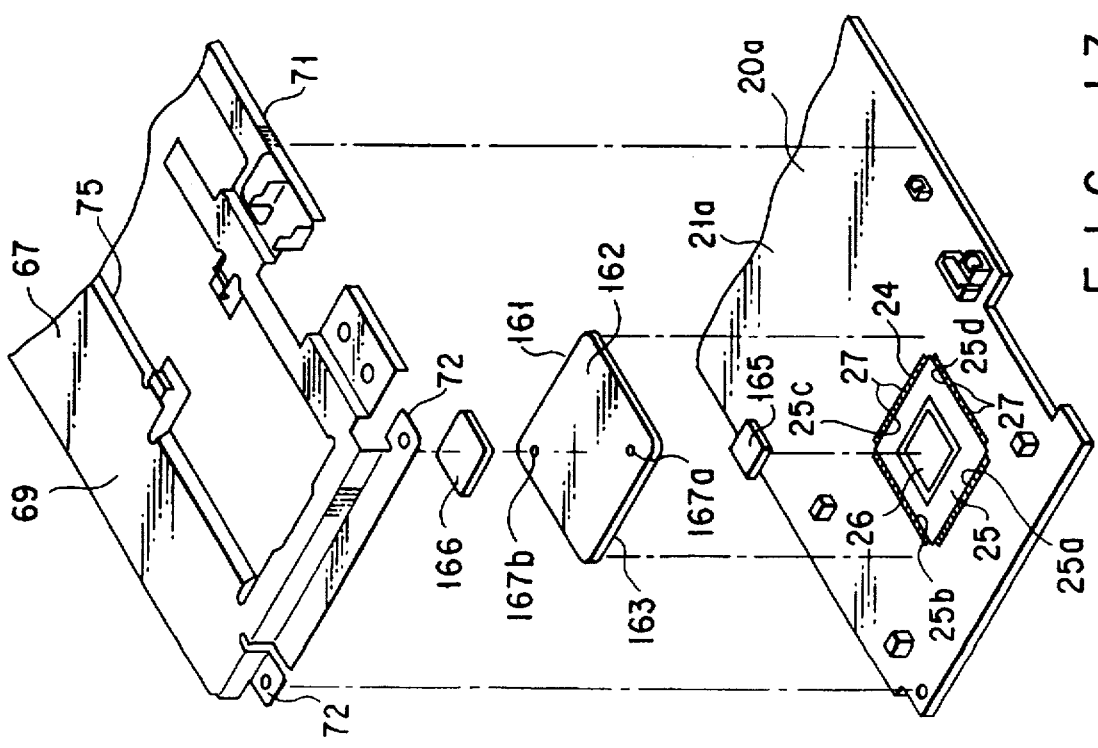
FIG. 13 is an exploded perspective view, showing the positional relationship of the TCP, the package cover and the first shield plate.

As shown in FIGS. 12A and 13, the TCP 24 comprises a carrier 25 made of resin film and an IC chip 26 mounted on the carrier 25. The carrier 25 is a rectangular frame having four edges 25a, 25b, 25c and 25d, any adjacent two of which extend at right angles to each other. The carrier 25 has a number of leads 27 made by etching a copper foil. One end portion of each lead 27 extends outwards from the carrier 25.

The IC chip 26 is a substantially square plate having a first chip surface 26a and a second chip surface 26b. A plurality of bumps (not shown) are provided on the edge portions of the first chip surface 26a. The leads 27 are connected at the other end to these bumps. The nodes of the leads 27 and the bumps are sealed in a mass of potting resin 28, which covers the first chip surface 26a of the IC chip 26. The second chip surface 26b of the IC chip 26 is exposed, not covered with bonding resin. Rather, it is electroplated with an electrically conductive layer.

As shown in FIG. 12A, the TCP 24 is mounted on the first circuit board 21a in so-called "face-up" position. In other words, the TCP 24 is positioned, with the first chip surface 26a facing away from the first circuit board 21a. Hence, the second chip surface 26b of the IC chip 26 opposes the upper surface 20a of the first circuit board 21a.

The second chip surface 26b of the IC chip 26 is adhered with thermally conductive adhesive 29 to the upper surface 20a of the first circuit board 21a. The leads 27 are soldered at one end to connection pads 30 which are provided on the upper surface 20a of the first circuit board 21a and which are spaced along the edges 25a, 25b, 25c and 25d of the carrier 25. The connection pads 30 are electrically connected to a wiring pattern 31 provided on the upper surface 20a of the first circuit board 21a.

The second circuit board 21b, which is located below the first circuit board 21a, is an input/output board. The board 21b is connected by a stacking connector (not shown) to the first circuit board 21a. The FDD 13 and the HDD 17 are connected to the second circuit board 21b.

The third circuit board 21c and the fourth circuit board 24d are arranged between the first circuit board 21a and the second circuit board 21b. The third circuit board 21c is a power-supply board, to which the battery pack 12 is connected. The third circuit board 21c is connected by a stacking connector (not shown) to the first circuit board 21a. The fourth circuit board 21d is an audio board and connected to the second circuit board 21b by a stacking connecting (not shown, either).

Figure 11:
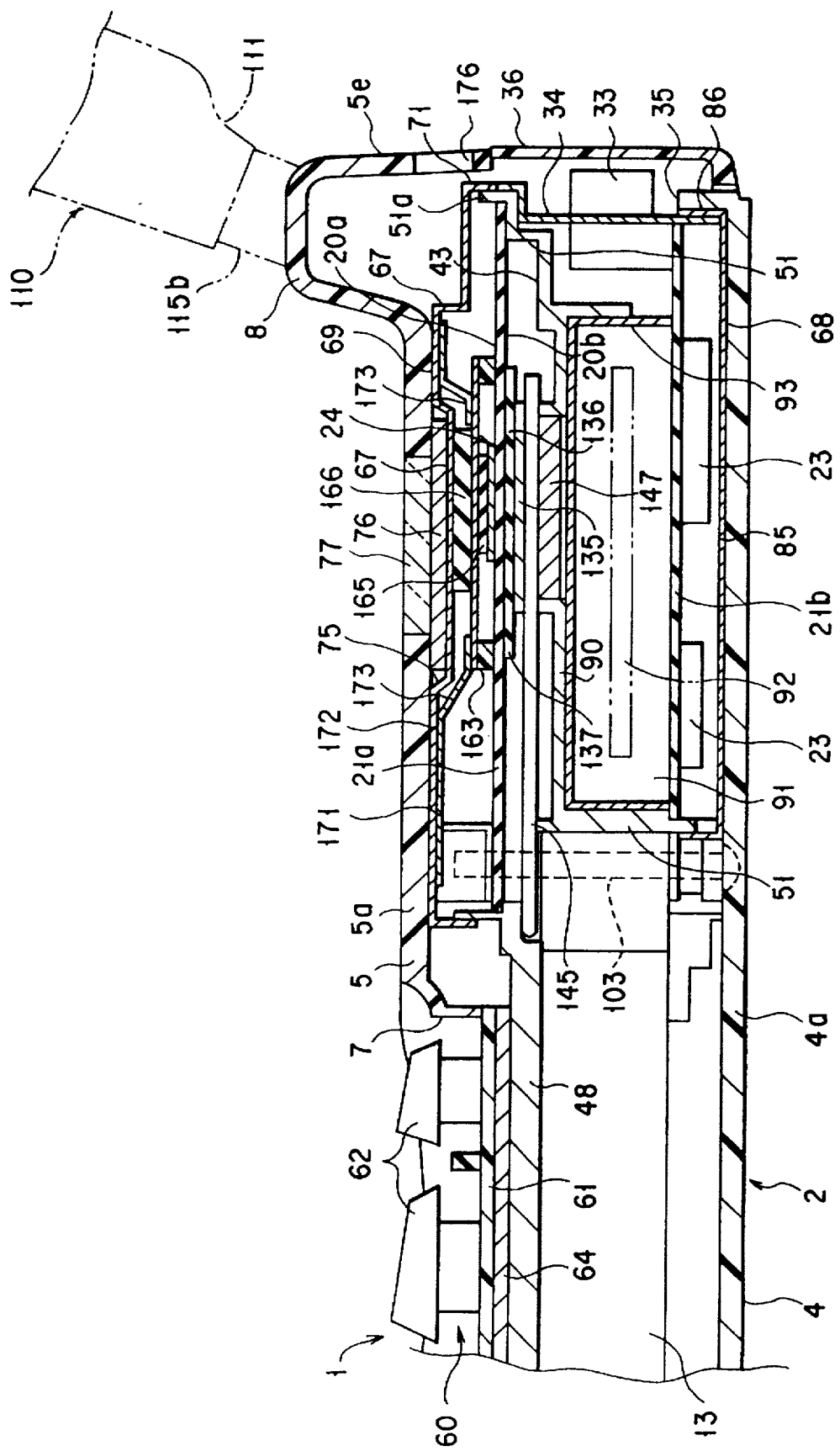
FIG. 11 is a sectional view of the portable computer of the first embodiment.

As shown in FIG. 11, a plurality of interface connectors 33 and a connector panel 34 made of a metal plate are fastened to the rear end of the second circuit board 21b. The interface connectors 33 are provided to connect peripheral apparatuses, such as a printer and an external CRT display, to the portable computer 1. The connector panel 34 covers the interface connectors 33 and the second circuit board 21b from the back. It also supports the interface connectors 33. The interface connectors 33 oppose connectors port 35. A connector cover 36 is attached to the rear of the lower housing half 4, covering the interface connectors 33.

Figure 9:
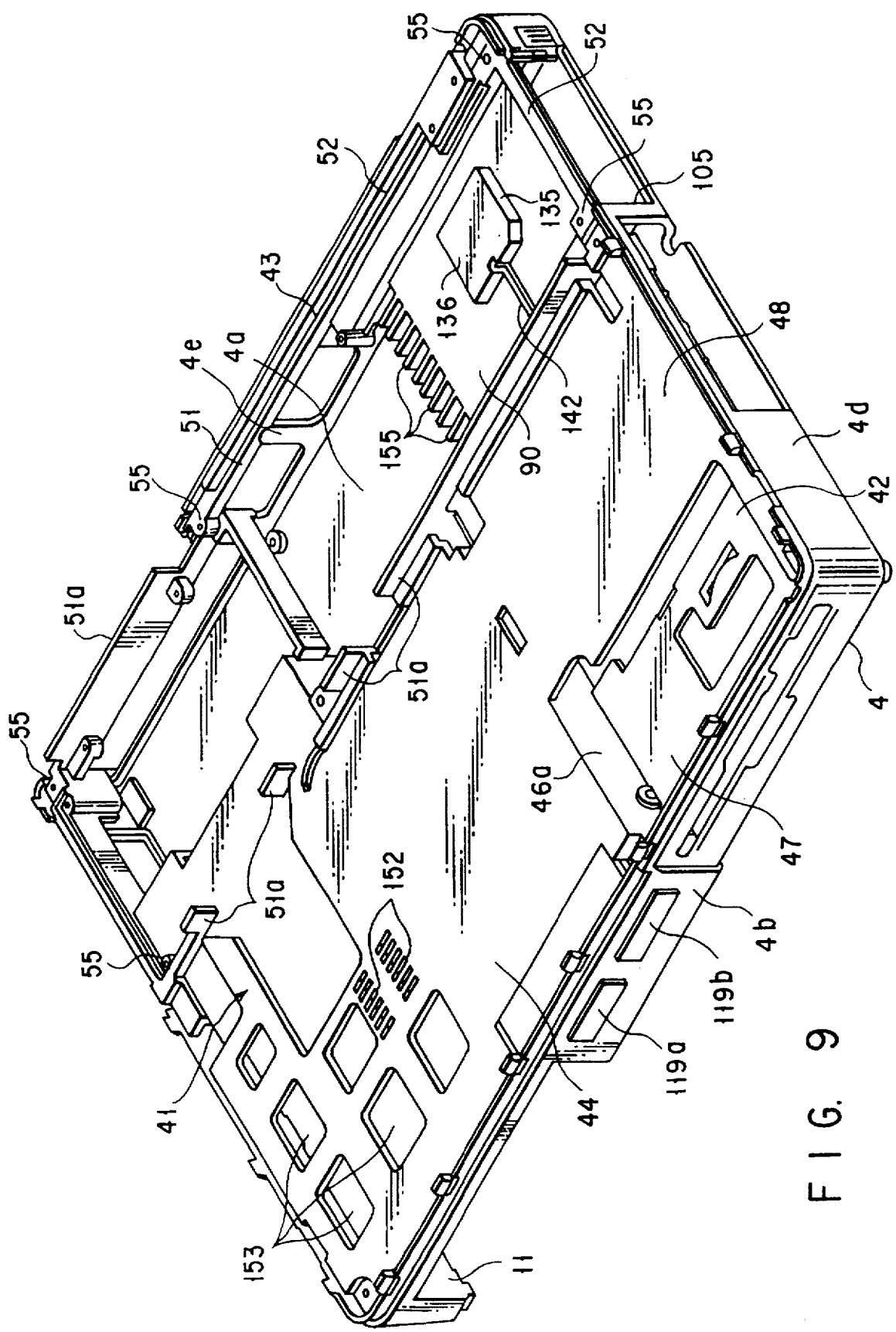
FIG. 9 is a perspective view of the lower housing half of the first embodiment, showing the frame fitted in the lower housing half.

As seen from FIGS. 3 and 4, the FDD 13 and the first to fourth circuit boards 21a to 21d are supported by a frame 41. The frame 41 is a die-cast product made of magnesium alloy which has thermal conductivity. As shown in FIG. 9, the frame 41 has such a size as to fit tightly in the lower housing half 4. The frame 41 comprises an FDD-supporting section 42, a board-supporting section 43 and a keyboard-supporting section 44 which are formed integral with one another. The section 42 is provided to support the FDD 13, the section 43 to support the first to fourth circuit boards 21a to 21d, and the section 44 to support the keyboard 60.

The FDD-supporting section 42 has a pair of side walls 46a and 46b, a bottom wall 47, and a top wall 48. The side walls 46a and 46b are parallel to each other. The bottom wall 47 extends between the side walls 46a and 46b and connected to the lower edges thereof. The top wall 48 extends between the side walls 46a and 46b and connected to the upper edges thereof. The FDD 13 is inserted in the space defined by the walls 46a, 46b, 47 and 48. The FDD 13 is held in that space, with its sides fastened to the side walls 46a and 46b by means of screws (not shown).

The board-supporting section 43 is connected to the rear end of the FDD-supporting section 42. It is as long as the lower housing half 4 is broad. The section 43 has a wall 51 shaped like a rectangular frame, surrounding the first and second circuit board 21a and 21b. The wall 51 has the substantially same height as the lower housing half 4. The wall 51 has an upper seat 52 and a lower seat 53 in its top and lower edges, respectively. On the upper seat 52 the peripheral edges of first circuit board 21a are mounted. On the lower seat 53 the peripheral edges of the second circuit board 21b are mounted. The wall 51 has a plurality of bosses 55 spaced apart in the lengthwise direction of the wall 51. The top and bottom of each boss 55 contact the upper seat 52 and the lower seat 53.

As illustrated in FIG. 3, the first circuit board 21a is mounted on the upper seat 52 of the board-supporting section 43 and fastened to the section 43 by screws 57 which are driven into the bosses 55. As shown in FIG. 4, the second circuit board 21b is mounted on the lower seat 53 of the board-supporting section 43 and fastened to the section 43 by screws 58 which are driven into the bosses 55.

As shown in FIGS. 3 and 4, those part of the wall 51 which are front and rear of the board-supporting section 43 has a plurality of support projections 51a and 51b. The support projections 51a extend upward, above the board-supporting section 43 and are taller than the upper seat 52. Namely, the support projections 51a extend upward above the first circuit board 21a. The support projections 51b extend downward, below the second seat 53, and below the second circuit board 21b.

Figure 8:
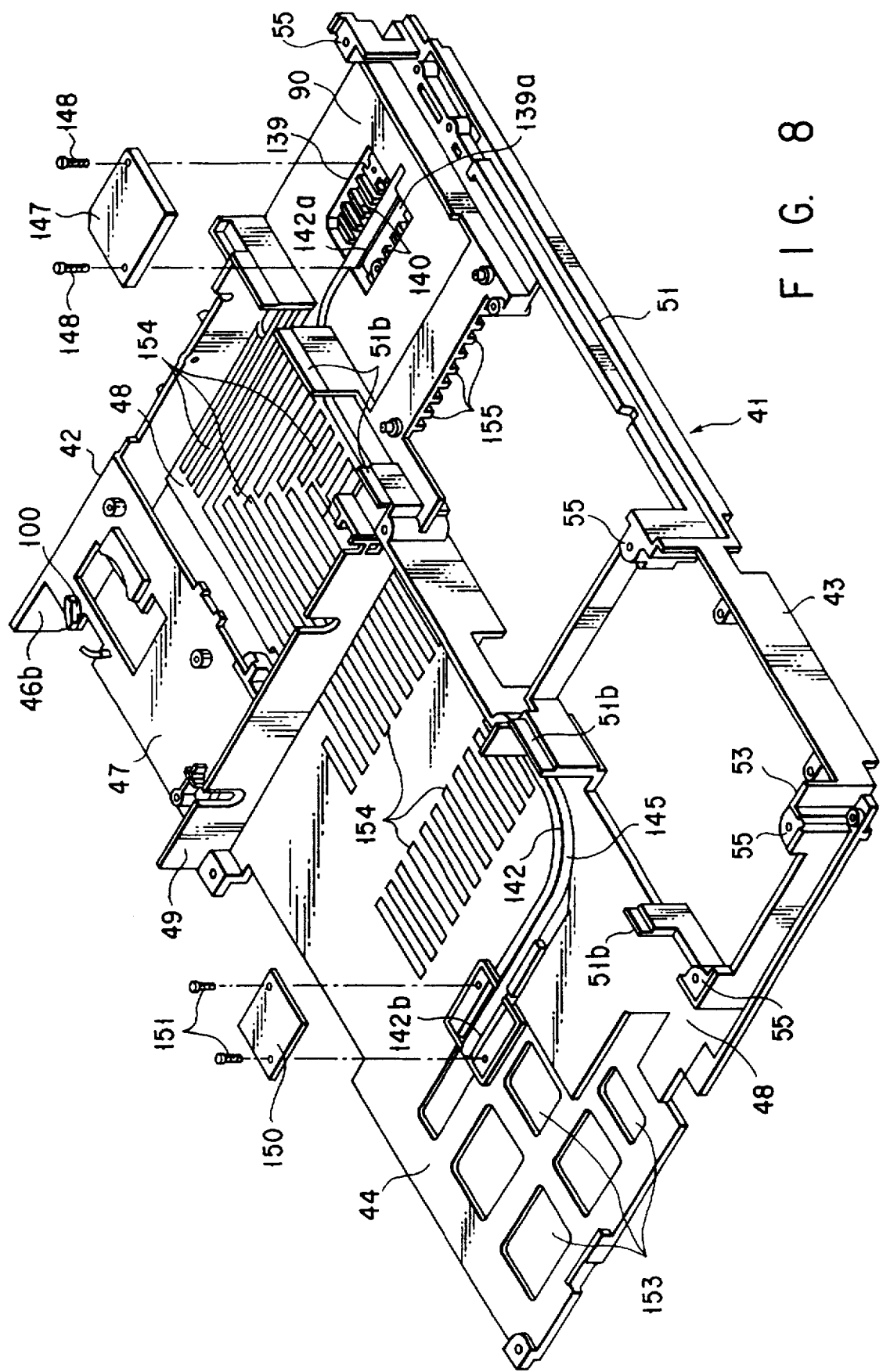
FIG. 8 is a perspective view of the frame of the first embodiment, illustrating the heat pipe mounted on the frame.

The keyboard-supporting section 44 is a rectangular plate, extending between the wall 51 and the side wall 46a of the FDD-supporting section 42. (The wall 51 makes the front of the FDD-supporting section 42.) The section 44 is substantially flush with the top wall 48 of the FDD-supporting section 42. The front half of the frame 41 is therefore an almost flat plate. As shown in FIG. 8, a support wall 49 protrudes downwards from the lower surface of the keyboard-supporting section 44. The support wall 49 is continuous to the left side wall 46a of the FDD-supporting section 42. The distal end of the wall 49 is located in the same plane as the distal end of the support projections 51b.

As shown in FIG. 10, the keyboard 60 is mounted on the front half of the frame 41. The keyboard 60 comprises a keyboard panel 61, a plurality of keys 62, a joy stick 63, and a reinforcing plate 64. The panel 61 is mounted on the keyboard-supporting section 44 and the top wall 48 of the FDD-supporting section 42. The keys 62 and the joy stick 63 (i.e., pointing device) are arranged on the upper surface of the keyboard panel 61. The reinforcing plate 64 is made of metal, covering the lower surface of the keyboard panel 61. The plate 64 contacts the upper surface of the keyboard-supporting section 44 and the upper surface of the top wall 48. The keyboard 60 is connected to the first circuit board 21a by a wiring board (not shown).

As seen from FIGS. 3, 4 and 11, two shield plates 67 and 68 are fastened to the board-supporting section 43 of the frame 41. Both shield plates are made of metal which is thermally conductive. The first shield plate 67 is located above the frame 41, covering the first circuit board 21a. The second shield plate 68 is located beneath the frame 41, covering the second circuit board 21b.

The first shield plate 67 comprises a plate 69, two flanges 70 and 71, and a plurality of tongues 72. The plate 69 has substantially the same size as the first circuit board 21a. The flanges 70 and 71 extend downwards from the front and rear edges of the plate 69, engaging the tops of the support projections 51a. The tongues 72 extend downwards from the plate 69, set in alignment with the bosses 55 of the board-supporting section 43. The tongues 72 are fastened to the first circuit board 21a by the above-mentioned screws 57.

The plate 69 has a panel-holding recess 75 formed by indenting the plate 69. The recess 75 is rectangular, extending in the lengthwise direction of the plate 69. Fitted in the recess 75 is an LCD (Liquid Crystal Display) panel 76 as illustrated in FIG. 10. The LCD panel 76 is designed to display the operating mode of the portable computer 1. The LCD panel 76 is connected to the first circuit board 21a by a flexible wiring strip 78 which has a connector 79. The panel 76 opposes the top wall 5a of the upper housing half 5. The top wall 5a has a window 77, through which the LCD panel 76 can be seen from outside.

As shown in FIG. 3, a disc-shaped speaker 81 is arranged between the first circuit board 21a and the first shield plate 67. The speaker 81 is held by a holder (not shown) which is fixed to the first circuit board 21a. The first shield plate 67 has an opening 82, through which the speaker 81 faces the top wall 5a of the upper housing half 5. The top wall 5a has small holes 83 which carry sound generated by the speaker 81 from the housing 3.

As shown in FIGS. 4 and 11, the second shield plate 68 comprises a plate 85, a flange 86, and a plurality of tongues 87. The plate 85 has substantially the same size as the second circuit board 21b. The flange 86 extends upwards from the rear edge of the plate 85, engaging the lower end of the connector panel 34. The tongues 87 extend upwards from the plate 85, set in alignment with the bosses 55 of the board-supporting section 43. The tongues 87 are fastened to the second circuit board 21b by the above-mentioned screws 58.

As seen from FIGS. 3 and 4, a partition wall 90 is formed integral with the right end part of the board-supporting section 43 of the frame 41. The partition wall 90 extends between the first circuit board 21a and the second circuit board 21b, parallel thereto. The wall 90 is located at the back of the FDD-supporting section 42 and is continuous to the top wall 48 of the section 42.

As illustrated in FIG. 11, a card receptacle 91 is provided between the second circuit board 21b and the partition wall 90. The card receptacle 91 opens at the right side, so that an extension card 92 such as an interface card or an application card (storing an application program) may be inserted into the receptacle 91. A card connector (not shown) is arranged at the end of the card receptacle 91. Noise may be generated at the node of the card connector and the extension card 92. To prevent the noise from leaking from the receptacle 91, a metal cover 93, shaped like an open box, is placed in the card receptacle 91.

As shown in FIG. 4, an extension circuit board 95 is arranged at the bottom of the FDD-supporting section 42. The extension circuit board 95 has a flexible wiring board 98, which is connected to the second circuit board 21b by the connectors 22. The lower surface of the extension circuit board 95 is covered with a metal shield plate 96, which is fastened by screws 97 to the bottom wall 47 of the FDD-supporting section 42. A battery holder 100 is formed integral with the bottom wall 47. Removably fitted in the battery holder 100 is an RTC (Real-Time Clock) battery 101. The RTC battery 101 is connected to the extension circuit board 95 by a cable 102.

As shown in FIG. 10, the frame 41 fixed to the FDD 13, the first circuit board 21a and the second circuit board 21b is fitted from the above into the lower housing half 4. Once the frame 41 is so fitted, its edges contacts the inner surfaces of the side walls 4b of the lower housing half 4, and the support wall 49 of the keyboard-supporting section 44 and the support projections 51b of the board-supporting section 43 contact, at their distal ends, the bottom wall 4a of the lower housing half 4. After the frame 41 is fitted into the lower housing half 41, the upper housing half 5 is connected to the lower housing half 4. The lower housing half 4, the upper housing half 5, and the frame 41 are fastened together by means of screws 103. The screws 103 pass through the bosses 55 of the frame 41 and are driven into the top wall 5a of the upper housing half 5. The lower housing half 4 and the upper housing half 5 are thereby fastened together, clamping the frame 41. In this condition, the upper surface of first shield plate 67 contacts the lower surface of the top wall 5a of the upper housing half 5.

As can be understood from FIG. 11, once the housing halves 4 and 5 have been connected together, the keyboard panel 61 have its edges clamped between the top wall 5a and the keyboard-supporting section 44, on the one hand, and the top wall 48 of the FDD-supporting section 42, on the other hand. The keyboard 60 is thereby secured to the housing 3, with the keys 62 and the joy stick 63 arranged in the rectangular opening 7 made in the top wall 5a of the upper housing half 5.

As shown in FIGS. 1 and 10, the lower housing half 4 has a card slot 105 in the right side. The card slot 105 communicates with the card receptacle 91. The slot 105 is covered with a card cover 106.

As seen from FIG. 10, the board-supporting section 43 supports a flat-panel type display unit 110. The display unit 110 comprises a housing 111 shaped like a flat box and a LCD 112 contained in the housing 111. The housing 111 has a pair of legs 15a and 115b. The legs 115a and 115b are inserted in the leg-holding recesses 9a and 9b of the upper housing half 5. They are rotatably connected to the board-supporting section 43 by hinges 116a and 116b, whereby the display unit 110 can be rotated. The LCD 112 is connected to a cable 117, which is led through the left leg 115a as shown in FIG. 10 and which is connected to a connector 118. The connector 118 is connected to the first circuit board 21a. As a result, the first circuit board 21a is connected to the LCD 112.

As shown in FIGS. 1 and 10, a pair of click switches 119a and 119b are arranged at the central part of the front of the lower housing half 4. The click switches 119a and 119b slightly protrude from the front of the lower housing half 4. One of the switches is pushed to cancel the command displayed by the LCD 112, and the other of the switches is pushed to execute the command.

The frame 41 and the first shield plate 67 are used as heatsinks for absorbing the heat which the TCP 24 generates while operating. The structure for radiating the heat will be described below.

Figure 12B:
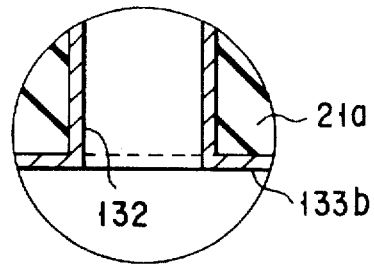
FIG. 12B is an enlarged sectional view of that part of the circuit board in which a through hole is made.

As shown in FIG. 12A, that part of the first circuit board 21a which opposes the TCP 24 has a number of through holes 131, which extend vertically. These holes 131 open at one end to the upper surface 20a of the first circuit board 21a and at the other end to the lower surface 20b of the first circuit board 21a. As shown in FIG. 12B, the inner surface of each through hole 131 is electroplated with a copper layer 132 which is thermally conductive.

Those parts of the surfaces 20a and 20b of the board 21a, which has the holes 131, are covered with heat-transmitting layers 133a and 113b, respectively. The layers 133a and 133b are made of copper foil and connected to the copper layers 132 electroplated on the inner surfaces of the through holes 131. It is to the heat-transmitting layer 133a that the IC chip 26 of the TCP 24 is adhered by the adhesive 29.

A heat-receiving member 135 is formed integral with the partition wall 90, protruding upwards from the upper surface of the partition wall 90. The heat-receiving member 135 has a flat heat-receiving surface 136 which opposes the lower surface 20b of the first circuit board 21a. The heat-receiving surface 136 is larger than the surface at which the IC chip 26 contacts the first circuit board 21a. The heat-receiving member 135 can therefore absorb heat from the IC chip 26 with high efficiency.

A soft, elastic sheet 137 is interposed between the lower surface 20b of the first circuit board 21a and the heat-receiving surface 136 of the frame 41. The sheet 137 is made of rubber-like material, such as a mixture of silicone resin and alumina, and is thermally conductive. The lower surface 20b of the first circuit board 21a contacts the elastic sheet 137, which in turn contacts the heat-receiving surface 136 of the frame 41.

Figure 6:
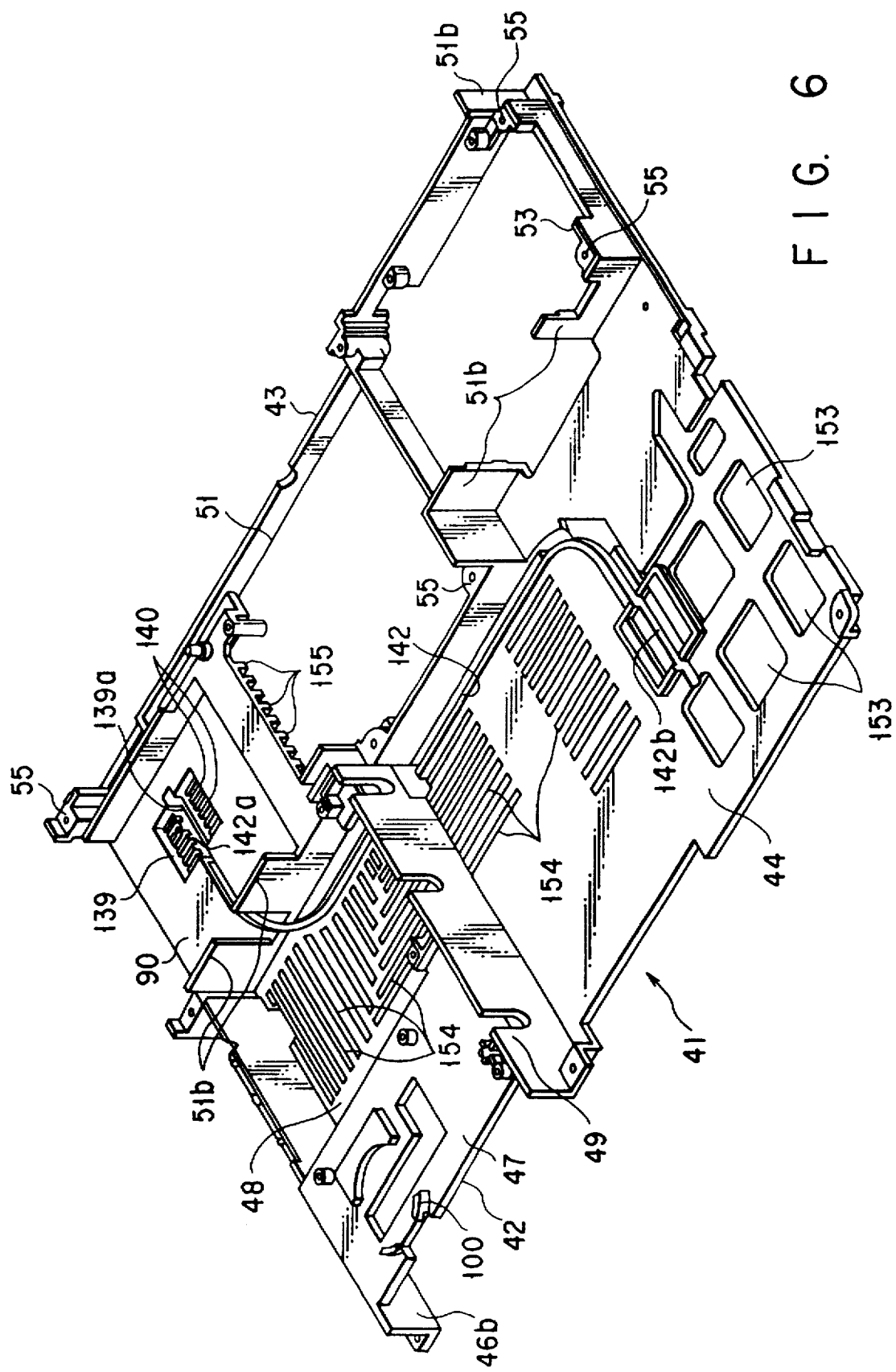
FIG. 6 is a perspective view of the frame of the first embodiment, showing the lower side thereof.

A recess 139 is made in the heat-receiving surface 135. The recess 139 faces downwards; it has a bottom 139a facing away from the heat-receiving surface 136. As shown in FIG. 6, heat-radiating fins 140 extend downwards from the bottom 139a of the recess 135.

Figure 7:
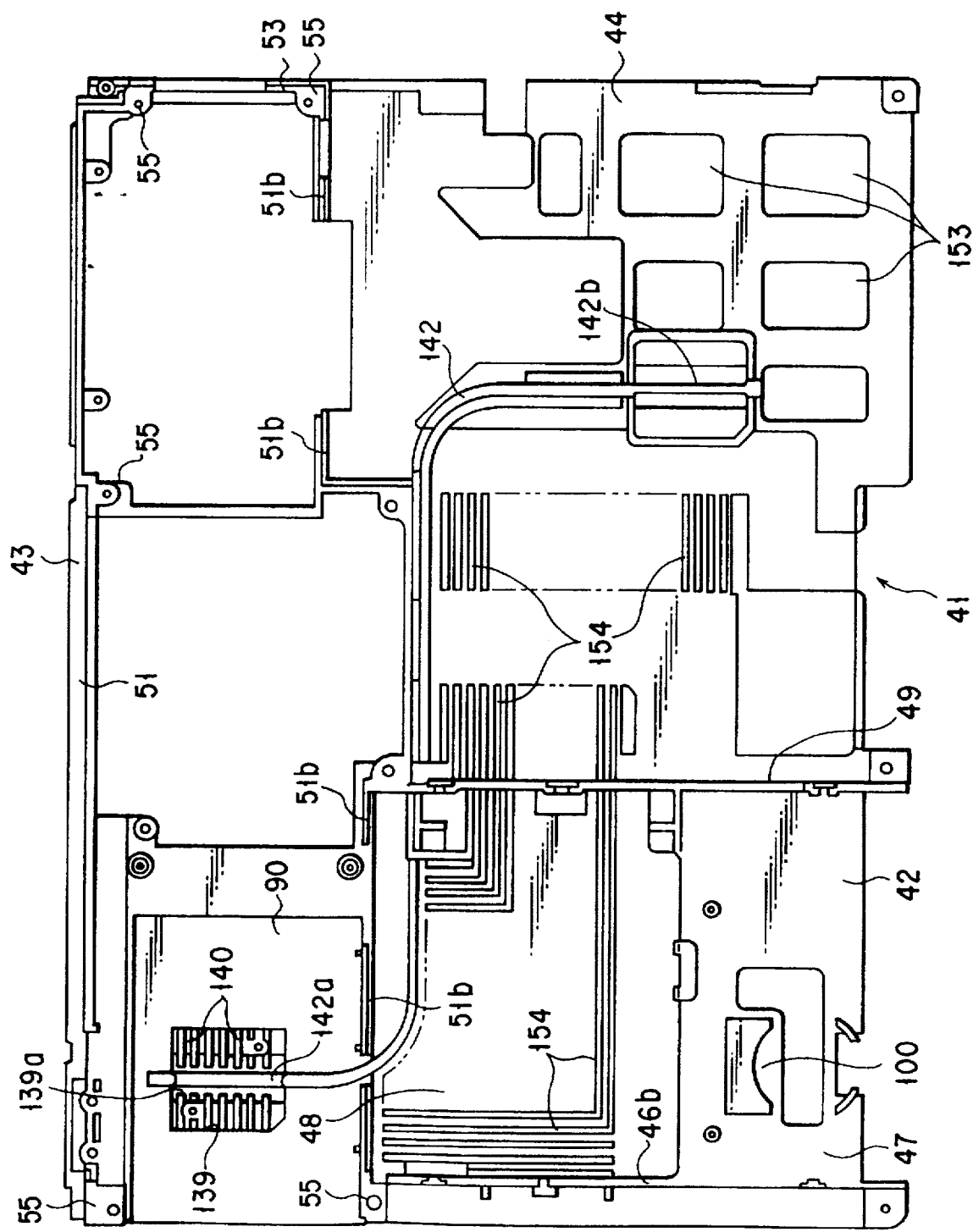
FIG. 7 is a plan view showing the frame of the first embodiment, as seen from the lower side.

As illustrated in FIGS. 6, 7 and 8, a guide groove 142 is made in the lower surface of the keyboard-supporting section 44 of the frame 41 and the lower surface of the top wall 48 connected to the section 44. The guide groove 142 extends along with width of the frame 41. The first end portion 142a of the groove 142 is curved, passes below the partition wall 90, and reaches the bottom 139a of the recess 139. The second end portion 142b of the groove 242 is curved away from the board-supporting section 43, at the middle part of the section 44, and reaches the front portion of the frame 41. The second end portion 142b of the groove 142 is located right above the battery receptacle 11. Thus, the guide groove 142 is bent in the form of letter S, such that its second end portion 142b is remote from the heat-receiving member 135.

A heat pipe 145 is fitted in the guide groove 142. The heat pipe 145 is of the known type; it comprises a metal pipe 146 filled with operation liquid. The heat pipe 145 contacts the entire inner surface of the guide groove 142.

As shown in FIG. 8, one end portion of the heat pipe 145 extends into the recess 139. A first pipe holder 147 made of metal is fitted in the recess 139 and fastened to the bottom 139a of the recess 139 by screws 148. The one end portion of the heat pipe 145 is clamped between the bottom 139a and the pipe holder 147. A second pipe holder 150, also made of metal, is fastened by screws 151 to the lower surface of the keyboard-supporting section 44, at that portion of the section 44 in which there is formed the second end portion 142b of the guide groove 142. The other end portion of the heat pipe 145 is clamped between the second pipe holder 150 and the keyboard-supporting section 44.

As seen from FIG. 9, a plurality of heat-radiating fins 152 are formed integral with the keyboard-supporting section 44. The fins 152 extend upwards from that portion of the section 44 which is aligned with the second pipe holder 150. The keyboard-supporting section 44 has lightening holes 153 which have been made at the time of die-casting the frame 41. These holes 153 are located adjacent to the other end portion of the heat pipe 145.

Figure 5:
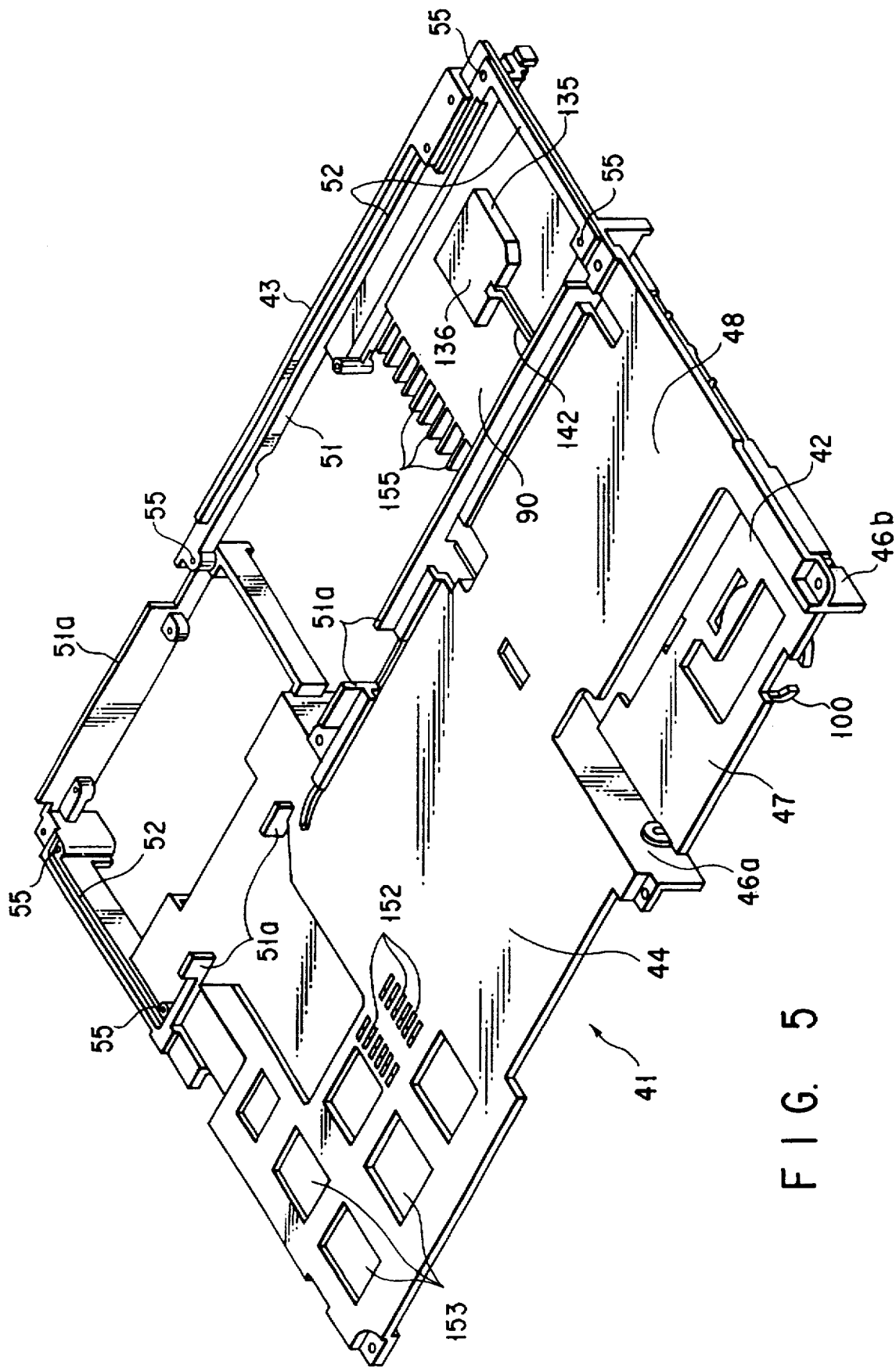
FIG. 5 is a perspective view of the frame of the first embodiment, showing the upper side thereof.

As FIGS. 6 and 8 show, a plurality of heat-radiating fins 154 are provided on the lower surface of the keyboard-supporting section 44 and on the lower surface of the top wall 48 of the FDD-supporting section 42. The fins 154 have been provided by forming grooves in the lower surfaces of the section 44 and the top wall 48. The fins 154 are located near the heat pipe 145 and extend parallel to one another. As shown in FIGS. 3 and 5, a plurality of heat-radiating fins 155 are formed integral with one edge of the partition wall 90 which has the recess 139.

As illustrated in FIG. 12A, a package cover 161 is arranged on the upper surface 20a of the first circuit board 21a, for protecting the TCP 24 from impact. The package cover 161 comprises a square panel 162 and an insulating member 163. The panel 162 is made of metal. The insulating member 163 is made of synthetic resin and adhered to the lower surface of the panel 162. The panel 162 is large enough to cover the entire TCP 24 from the above. The panel 162 is so positioned that its central part opposes the first chip surface 26a of the IC chip 26. The insulating member 163 is shaped like a square frame and has four sides aligned with the four sides of the panel 162. The member 163 is adhered to the upper surface 20a of the first circuit board 21a, surrounding the nodes of the leads 27 and the connection pads 30.

A first elastic sheet 165 is interposed between the panel 162 and the IC chip 26. The first elastic sheet 165 is made of rubber-like material, such as a mixture of silicone resin and alumina, and is thermally conductive. The first elastic sheet 165 contacts the lower surface of the panel 162 and the first chip surface 26a of the IC chip 26, so as to transmit the heat from the IC chip 26 directly to the panel 162. The upper surface of the panel 162 opposes the plate 69 of the first shield plate 67. Between the plate 69 and the panel 162 there is interposed a second elastic sheet 166. Like the first elastic sheet 165, the second elastic sheet 166 is made of rubber-like material, such as a mixture of silicone resin and alumina, and is thermally conductive. It is thicker than the first elastic sheet 165. The second elastic sheet 166 contacts the upper surface of the panel 162 and the lower surface of the plate 69, so as to transmit the heat from the panel 162 to the plate 69.

As shown in FIG. 13, the square panel 162 of the package cover 161 has two holes 167a and 167b in the opposing corners. Through these holes 167a and 167b it is possible to determine whether or not the package cover 161 takes the desired position with respect to the TCP 24 after the package cover 161 has covered the TCP 24.

Figure 14:
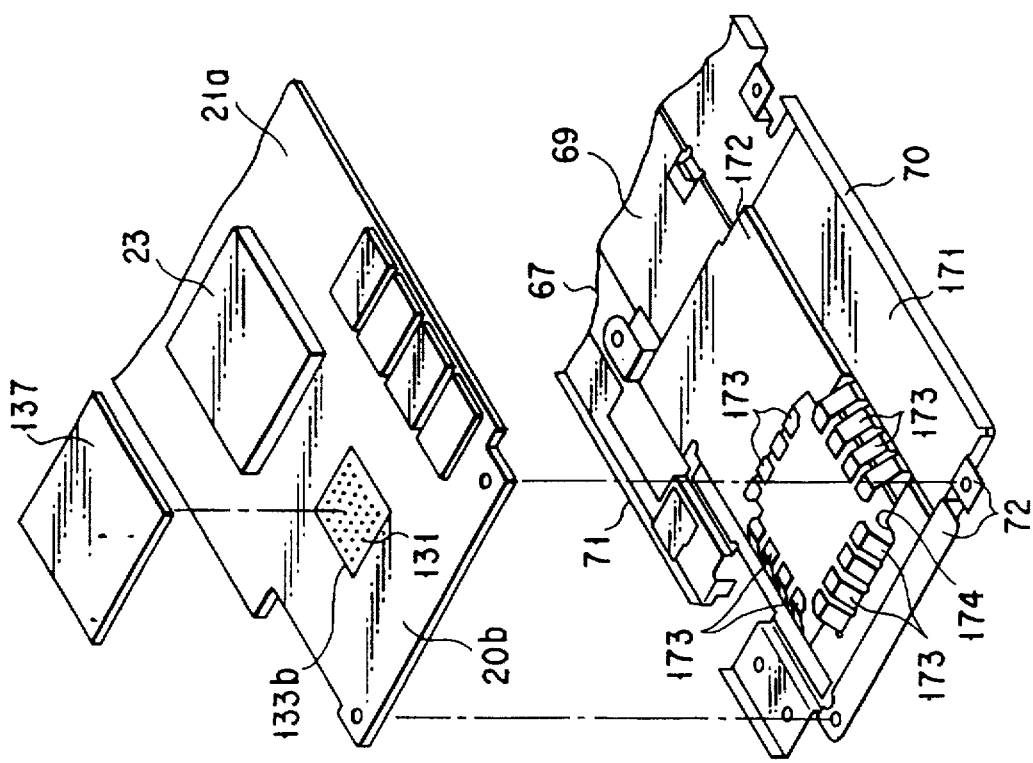
FIG. 14 is an exploded perspective view, depicting the positional relationship of the first shield plate and the first circuit board.

As shown in FIG. 14, a heat-transmitting plate 171 is fastened to the lower surface of the plate 69. The plate 171 is a thin copper plate and excels in thermal conductivity. More precisely, the plate 171 has a proximal part 172 which is fixed to the lower surface of the plate 69. The proximal part 172 has a square opening 174 in that part which opposes the package cover 161. A plurality of contacts 173 extend downwards from the edges of the opening 174 can be elastically deformed to rotate toward and away from the plate 69. The contacts 174 remain in contact with the upper surface of the panel 162.

As seen from FIGS. 2 and 11, the housing 3 has a plurality of air holes 176 in the rear end. The air holes 176 are located near the first circuit board 21a and the first shield plate 67. These holes 176 facilitate a flow of air from and into the space in which the TCP 24 is provided.

During the use of the portable computer 1, the TCP 24 consumes electric power and the IC chip 26 generates heat. The heat is transmitted to the first circuit board 21a since the second chip surface 26b of the IC chip 26 is connected by the adhesive 29 to the upper surface 20a of the first circuit board 21a. From the first circuit board 21a the heat is dissipated to the board-supporting section 43 of the frame 41. This is because the heat-receiving member 135 of the frame 41 supporting the board 21a contacts that part of the lower surface 20b of the board 21a which is aligned with the TCP 24.

The through holes 131 made in the first circuit board 21a serve as passages for transmitting the heat from the IC chip 26 to the heat-receiving surface 136 of the frame 41. The heat generated by the IC chip 26 is transmitted not only to the first circuit board 21a, but also to the heat-receiving member 135 of the frame 41 via the heat-transmitting layers 133a and 133b and the copper layers 132. This is because, as described above, the heat-transmitting layers 133a and 133b are provided on the surfaces 20a and 20b of that part of the board 21a on which the IC chip 26 is adhered, and the copper layers 132 are electroplated on the inner surfaces of the through holes 131. As a result, the heat generated by the IC chip 26 can be dissipated via the board-supporting section 43 of the frame 41 with high efficiency.

Since the frame 41 is made of magnesium alloy which can transmits heat well, the heat transmitted to the board-supporting section 43 is conducted to the FDD-supporting section 42 and the keyboard-supporting section 44. The heat generated by the IC chip 26 is ultimately dissipated into a large region, not accumulated in the frame 41.

Extending from the heat-receiving member 135 to the keyboard-supporting section 44, the heat pipe 145 on the frame 41 absorbs about 20 to 30% of the heat transmitted to the heat-receiving member 135. Hence, the one end portion of the heat pipe 145, which is connected to the heat-receiving member 135, is heated. The operation liquid in this end portion of the pipe 145 evaporates, generating vapor. The vapor flows at high speed to the other end portion of the heat pipe 145, which is connected to the keyboard-supporting section 44. In other words, the heat is fast and positively diffused from the heat-receiving member 135 to the keyboard-supporting section 44.

Therefore, the frame 41 is not excessively or locally heated. That is, heat is uniformly distributed in the frame 41. Since the frame 41 has substantially the same size as the lower housing half 4, it has a relatively large heat-radiating surface. The heat the frame 41 holds per unit area is comparatively small.

The frame 41 to which the heat is transmitted from the IC chip 26 contacts the bottom wall 4a and side walls 4b of the lower housing half 4. The heat is finally dissipated to the lower housing half 4 and radiated outside the housing 3 from the bottom 4a and side walls 4b of the lower housing half 4.

The first chip surface 26a of the IC chip 26, which is coated with the potting resin 28, contacts the first elastic sheet 165, which in turn contacts the panel 162 of the package cover 161. The panel 162 contacts the second elastic sheet 166, which in turn contacts the first shield plate 67. Therefore, the heat the IC chip 26 has generated is transmitted to the first shield plate 67 through the first elastic sheet 165, the panel 162 and the second elastic sheet 166.

Since the heat-transmitting plate 171 secured to the first shield plate 67 has the contacts 173 which contact the panel 162, the heat transmitted to the panel 162 is dissipated to the first shield plate 67 through the contacts 173. Like the frame 41, the first shield plate 67 is made of metal having high thermal conductivity. The heat is therefore distributed uniformly in the first shield plate 67. Since the first shield plate 67 contacts the top wall 5a of the upper housing half 5, the heat from the IC chip 26 is radiated outside the housing 3 from the top wall 5a, as well.

Thus, the heat the IC chip 26 has generated can be dissipated not only to the frame 41 but also to the first shield plate 67. The heat can be dissipated from the TCP 24 with high efficiency, though the TCP 24 has neither heat-radiating fins nor heatsinks. Namely, the TCP 24 does not accumulate heat, though it has neither heat-radiating fins nor heatsinks.

As indicated above, the first elastic sheet 165 is interposed between the first chip surface 26a of the IC chip 26 and the package cover 161, and the second elastic sheet 166 is interposed between the package cover 161 and the first shield plate 67. Therefore, if a force is applied on the first shield plate 67 via the top wall 5a of the upper housing half 5 to bend the plate 67, both elastic sheets 165 and 166 will be deformed to absorb that force, and no excessive force will be exerted on the IC chip 26. Furthermore, if an impact is applied from the housing 3 to the frame 41, the elastic sheet 137 interposed between the first circuit board 21a and the heat-receiving surface 136 of the frame 41 will be deformed to absorb that impact, thereby protecting the TCP 24 against the impact.

Hence, the mechanically fragile TCP 24 can be protected from external forces, while heat is efficiently from the TCP 24 to the frame 41 and the first shield plate 67.

As described above, the frame 41 has a number of fins 152, 154 and 155, and its surface area is very large. The frame 41 can therefore radiate heat with high efficiency. In addition, since the fins 152, 154 and 155 have been formed at the time of die-casting the frame 41, they serve to make the frame 41 have a uniform thickness and to prevent the frame from warping or deforming. Formed by making grooves in the lower surface of the frame 41, the heat-radiating fins 154 and 155 function as ribs, rendering the frame 41 rigid without increasing the weight thereof.

Moreover, located adjacent to the heat pipe 145, the heat-radiating fins 152, 154 and 155 can radiate heat from the pipe 145 with high efficiency. The vapor in the heat pipe 145 is quickly condensed into operation liquid, which readily and continuously flows back to the heat-receiving member 135. The heat pipe 145 transfers heat effectively and efficiently, diffusing the heat generated by the IC chip 26 into the frame 41 which is relatively large.

The frame 41 to which the heat is transmitted from the IC chip 26 supports the FDD 13 and is arranged near the HDD 17 and the battery pack 12. This may raise the ambient temperature of the battery pack 12, the FDD 13, and the HDD 17. Nonetheless, since the frame 41 has a large surface area and excels in thermal conductivity, the heat can be efficiently dissipated from the IC chip 26, whereby the temperatures of the frame 41 and the housing 3 differ but slightly from the temperature outside the housing 3. No local accumulation of heat takes place in the housing 3. The influence of heat on the FDD 13, the HDD 17 and the battery pack 12 is therefore minimized.

The keyboard-supporting section 44 to which the heat is dissipated from the IC chip 26 through the heat pipe 145 is located right above the battery pack 12 to which heat should not be transmitted. Despite this, the section 44 does not apply much heat to a region in which the battery pack 12 is arranged, since the section 44 has many lightening holes 153 in that part which opposes the heat pipe 145. The edges of each lightening hole 153 functions as a heat-radiating fin. The holes 153 increase the heat-radiating ability of the keyboard-supporting section 44. As a result, the frame 41 can efficiently radiate heat, and the ambient temperature of the battery pack 12 can yet be prevented from rising.

Furthermore, since the heat pipe 145 diffuses the heat generated by the IC chip 26 into the relatively large frame 14, the frame 41 can be made of magnesium alloy which is less thermal conductive than, but lighter than, a greatly thermal conductive metal such as aluminum. The frame 41, which has substantially the same size as the lower housing half 4, is relatively light. This helps to decrease the weight of the portable computer 1 as is desired.

The present invention is not limited to the first embodiment described above. Several other embodiments of the present invention will be described below.

FIGS. 15 to 19 show a portable computer which is the second embodiment of the invention. The second embodiment is identical to the first embodiment, except that a different structure is used to promote the radiation of heat from the TCP 24. The components similar or identical to those of the first embodiment are denoted at the same reference numerals in FIGS. 15 to 19 and will not be described in detail in the following description.

Figure 17:
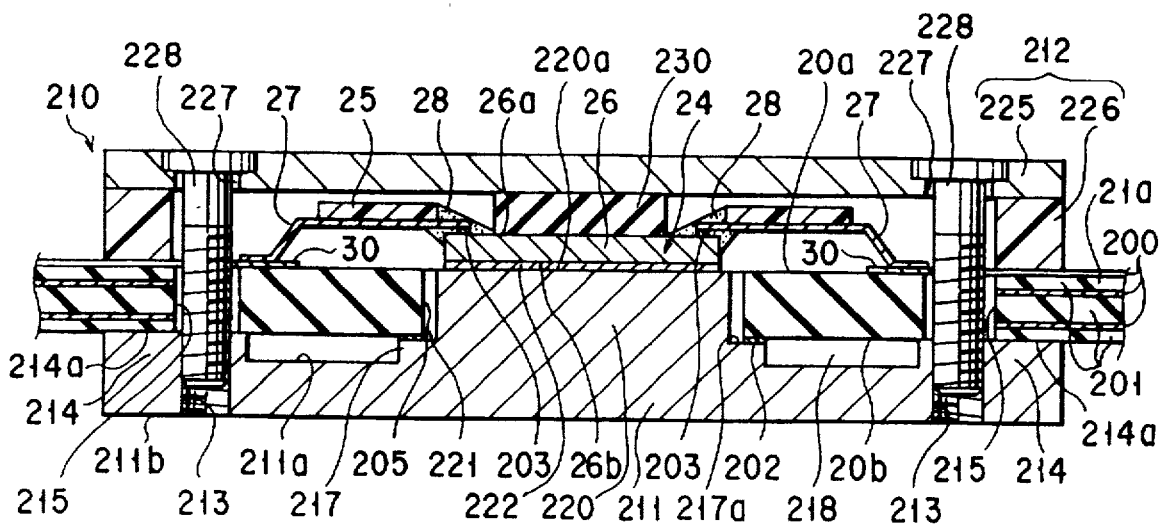
FIG. 17 is a sectional view of that part of the second embodiment to which a TCP is fastened.
Figure 18:
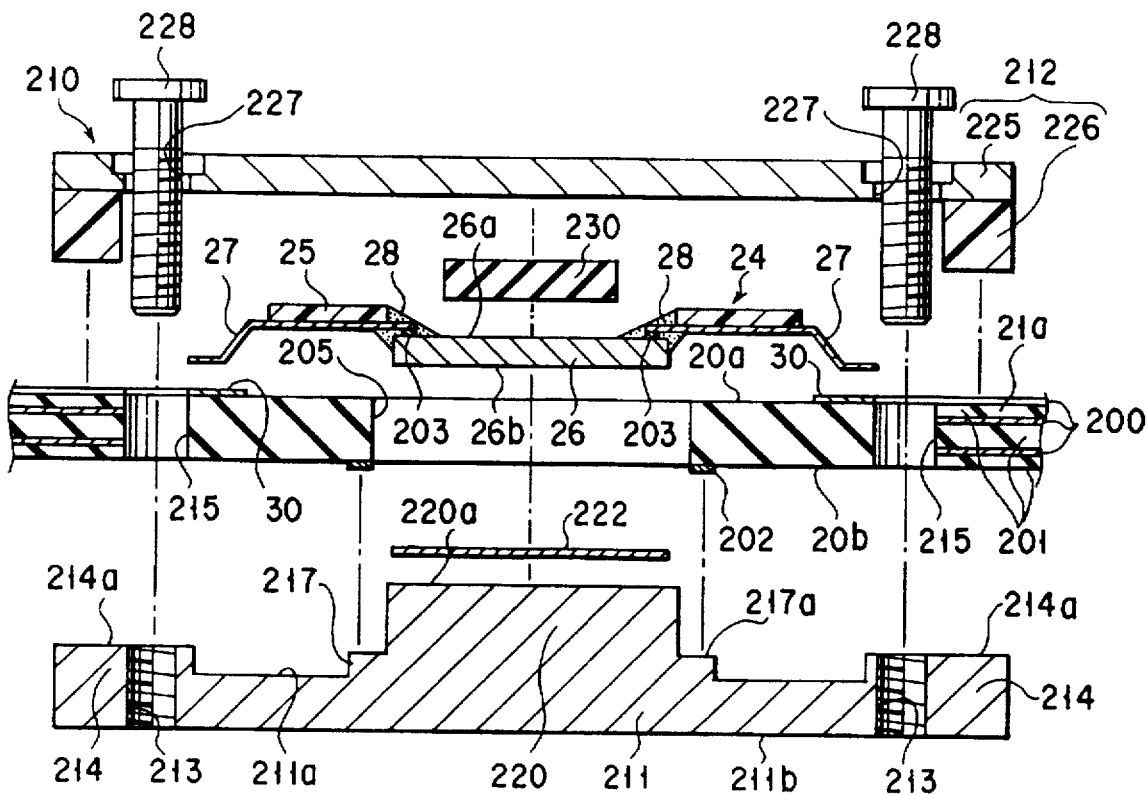
FIG. 18 is an exploded sectional view, showing the circuit board, TCP and radiator of the second embodiment.

As illustrated in FIGS. 17 and 18, the first circuit board 21a supporting the TCP 24 is of multi-layered structure. More specifically, the board 21a comprises three wiring layers 200 and three insulating layers 201 which are alternately laid, one upon another. The wiring layers 200 are electrically connected to the connection pads 30 provided on the upper surface of the board 21a. The uppermost wiring layer 200 defines the upper surface 20a of the board 21a. A ground wiring layer 202 is provided on the lower surface 20b of the first circuit board 21a.

The TCP 24 used in the second embodiment is basically identical in structure to its counterpart of the first embodiment. The TCP 24 has a plurality of bumps 203 on the edge portions of the first chip surface 26a. Leads 27 are connected at other end to these bumps 203. The nodes of the leads 27 and the bumps 203 are sealed in a mass of potting resin 28, which covers the first chip surface 26a of the IC chip 26. As shown in FIG. 17, the TCP 24 is mounted on the first circuit board 21a in face-up position, with the first chip surface 26a facing away from the first circuit board 21a. The leads 27 are soldered at one end to the above-mentioned connection pads 30.

Figure 19:
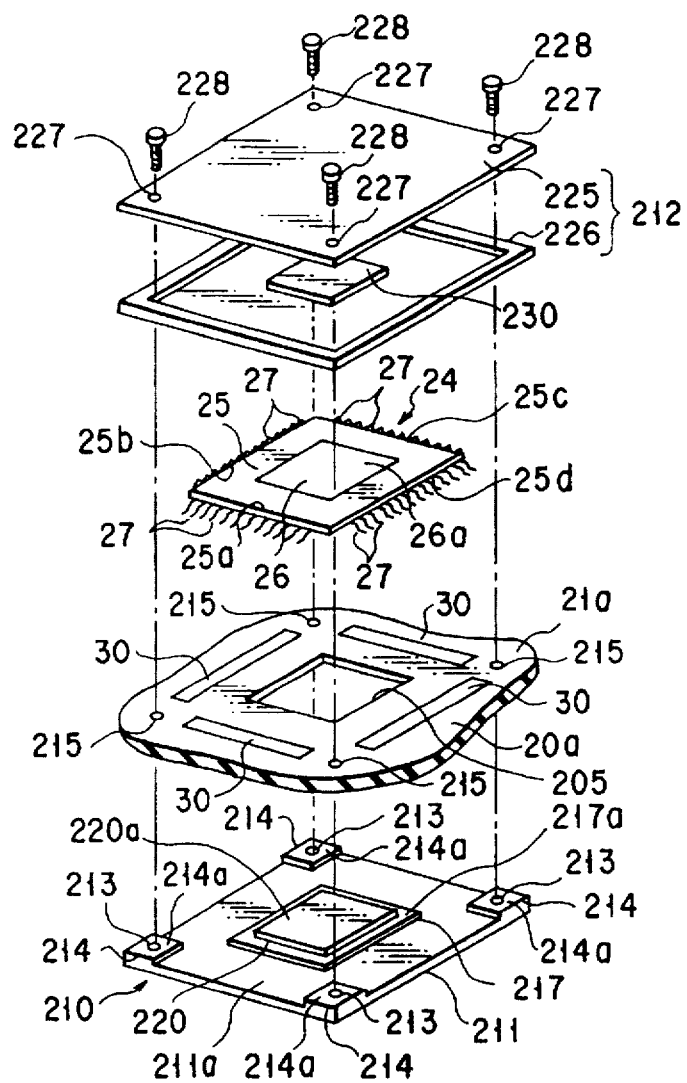
FIG. 19 is an exploded perspective view, showing the circuit board, TCP and radiator of the second embodiment.

As shown in FIG. 19, The first circuit board 21a has a square opening 205 which is vertically aligned with the TCP 24. The opening 205 is similar in shape to the IC chip 26 and is slightly larger than the IC chip 26. The IC chip 26 faces the square opening 205 and surrounded by the connection pads 30.

As seen from FIG. 18, the wiring layers 200 of the first circuit board 21a do not exist in that part of the first circuit board 21a on which the TCP 24 is mounted. Said part of the board 21a consists of the insulating layers 201 only. It is in these insulating layers 201 that the square hole 205 is made.

A radiator 210 is fastened to that part of the board 21a on which the TCP 24 is mounted. The radiator 210 comprises a main body 211 and a cover 212. The main body 211 arranged at the upper surface 20a of the board 21a. The cover 212 arranged at the lower surface 20b of the board 21a. The main body 211 and the cover 212 clamp the first circuit board 21a. The main body 211 is made of a metallic material having high thermal conductivity and high electrical conductivity, such as aluminum alloy. The main body 211 is a flat square block larger than the square opening 205 of the first circuit board 21a. It has a flat upper surface 211a which opposes the lower surface 20b of the board 21a, and a flat lower surface 211b which is parallel to the upper surface 211a. The main body 211 has four bosses 214 in the upper surface 211a, located at the four corners. Each boss 214 has a screw hole 213 and a flat support surface 214a at which the hole 213 opens. The support surfaces 214a of the bosses 214 are positioned in the same plane and contact the lower surface 20b of the first circuit board 21a.

The first circuit board 21a has four holes 215 in the portions other than that portion on which the TCP 24 is mounted. The holes 215 are axially aligned with the screw holes 213 made in the main body 211 of the radiator 210.

A seat 217 is formed integral with the central part of the main body 211, protruding from the upper surface 211a thereof. The seat 217 has a flat seat surface 217a which faces the square opening 205 of the first circuit board 21a. The seat surface 217a is larger than the square opening 205. The edge portions of the seat 217 contact the lower surface 20b of the board 21a, whereby the main body 211 closes the square opening 305.

As shown in FIGS. 17 and 18, the ground wiring layer 202 on the lower surface 20b of the board 21a surrounds the square hole 205. The wiring layer 202 contacts the seat surface 217a. As long as the main body 211 remains on the lower surface 20b of the first circuit board 21a, its upper surface 211a is below the lower surface 20b of the board 21a, remote therefrom at a distance equal to the height of the bosses 214 and the seat 217. A first gap 218 is provided between the lower surface 20b of the board 21a and the upper surface 211a of the main body 211.

As shown in FIGS. 18 and 19, a projection 220 is integral formed with the central part of the main body 211, protruding from the seat surface 217a into the square opening 205 of the first circuit board 21a. Between the sides of the projection 220 and the inner surfaces of the opening 205 there is a continuous gap 221 surrounding the projection 220. The projection 220 has a contact surface 220a at its distal end. The contact surface 220a is exposed to the upper surface 20a of the board 21a through the square opening 205. The contact surface 220a is larger than the second chip surface 26b of the IC chip 26 and is flush with the upper surface 20a of the board 21a. The IC chip 26 is adhered to the contact surface 220a by an adhesive layer 222. The adhesive layer 222 is an electrically conductive die-attach member which is interposed between the contact surface 220a and the second chip surface 26b of the IC chip 26. The phrase "flush with" used here does not necessarily mean that the contact surface 220a and the upper surface 20a are in an identical plane. Rather, it means that the contact surface 220a may be rough, having small projections and small recesses.

As illustrated in FIGS. 17, 18 and 19, the cover 212 of the radiator 210 comprises a substantially square panel 225 and a frame 226 made of synthetic resin and adhered to the lower surface of the panel 225. The panel 225 is made of a metallic material having high thermal conductivity, such as aluminum alloy. The panel 225 has almost the same size as the main body 211. The lower surface of the panel 225 opposes the first chip surface 26a of the IC chip 26. The frame 226 holds the four edges of the panel 225, surrounding the nodes of the leads 27 and the connection pads 30. The panel 225 has four through holes 227 in the four corners. The through holes 227 communicate with the holes 215 of the first circuit board 21a and, hence, with the screw holes 213 of the main body 211.

Four screws 228 are inserted in the holes 227 of the panel 225 and the holes 215 of the board 21a and driven into the screw holes 213 of the main body 211. The main body 211, the first circuit board 21a, and the cover 212 are thereby fastened together, with the board 21a clamped between the body 211 and the cover 212. The TCP 24 is provided between the main body 211 and the cover 212, and the cover 212 protects the TCP 24 against impacts.

A soft heat-transmitting sheet 230 is interposed between the panel 225 of the cover 212 and the first chip surface 26a of the IC chip 26. The sheet 230 is made of rubber-like material, such as a mixture of silicone resin and alumina, and is thermally conductive. The sheet 230 transmits the heat generated by the IC chip 26 to the panel 225.

Figure 15:
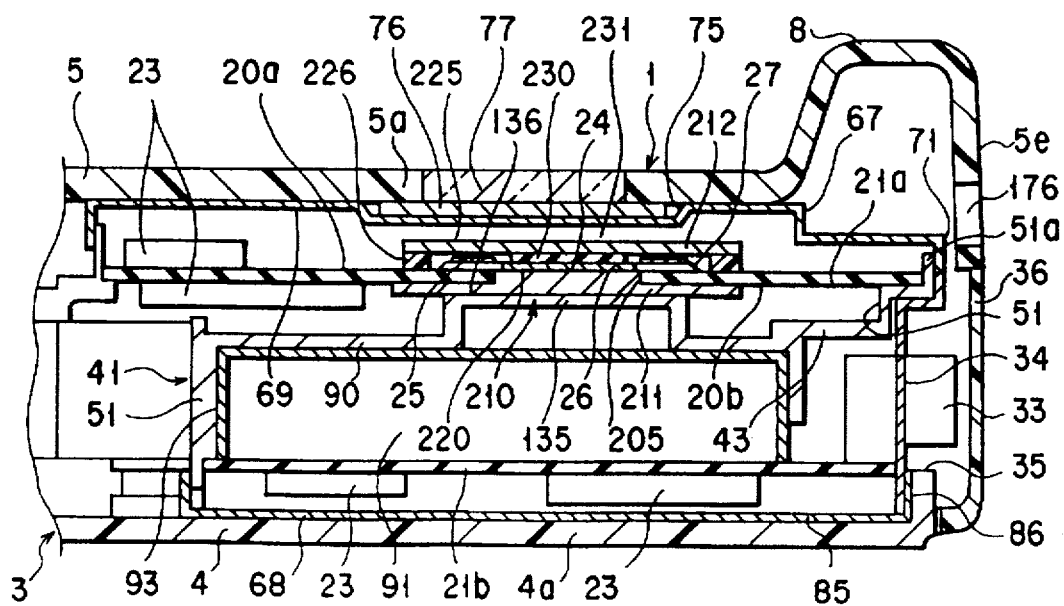
FIG. 15 is a sectional view of a portable computer according to a second embodiment of the invention, illustrating a housing which contains the circuit board having a TCP.
Figure 16:
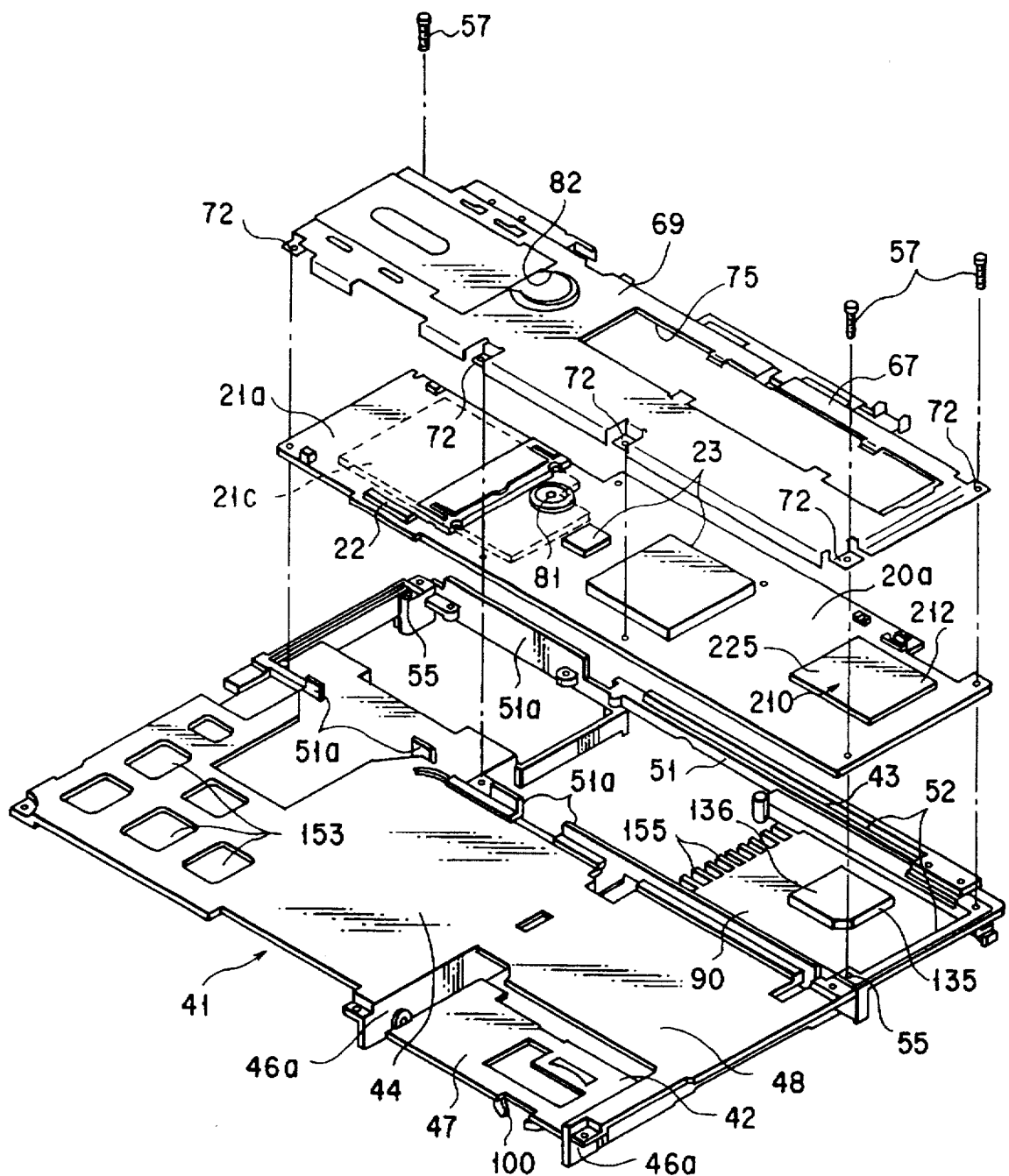
FIG. 16 is an exploded perspective view of the frame, circuit board and shield plate of the second embodiment.

As shown in FIGS. 15 and 16, the main body 211 of the radiator 210 is located right above the heat-receiving member 135 of the frame 41. The heat-receiving surface 136 of the member 135 contacts the lower surface 211b of the main body 211. The interface between the member 135 and the main body 211 is located right below the IC chip 26. The first shield plate 67 covers the cover 212 of the radiator 210. A gap 231 is provided between the first shield plate 67 and the cover 212.

As indicated above, the radiator 210 is fastened to that part of the board 21a on which the TCP 24 is mounted. The projection 220 protruding the main body 211 of the radiator 210 is inserted in the square opening 205 of the first circuit board 21a. The IC chip 26 is adhered to the contact surface 220a of the projection 220 by the adhesive layer 222 interposed between the surface 220a and the second chip surface 26b of the IC chip 26. The heat the IC chip 26 generates while operating is dissipated from the contact surface 220a to the main body 211 through the projection 220. In other words, the projection 220 and the adhesive layer 222 constitute a heat passage connecting the IC chip 26 to the main body 211 of the radiator 210.

There are no nodes of the leads 27 and the connection pads 30 on that part of the second chip surface 26b of the IC chip 26 which contacts the surface 220a of the projection 220. The whole second chip surface 26b of the IC chip 26 can therefore serve as a heat-transmitting surface. In addition, since the contact surface 220a of the projection 220 is larger than the second chip surface 26b of the IC chip 26, the heat generated by the IC chip 26 can be transmitted to the projection 220 from the entire second chip surface 26b of the IC chip 26. Further, the IC chip 26 remains in firm contact with the contact surface 220a because the IC chip 26 is clamped between the contact surface 220a and the heat-transmitting sheet 230 and pressed onto the contact surface 220a of the projection 220.

In the second embodiment, fastened together by the adhesive layer 222, the IC chip 26 and the projection 220 are not displaced with respect to each other. Nor is a space provided between the IC chip 26 and the projection 220. Hence, heat can be transmitted from the IC chip 26 to the main body 211 of the radiator 210 with high efficiency. Moreover, since the main body 211 contacts the heat-receiving member 135 of the frame 41, the heat transmitted from the IC chip 26 to the main body 211 is diffused into the entire frame 41. Heat can be dissipated from the TCP 24 efficiently, though the TCP 24 has no heat-radiating fins.

Since both the heat-transmitting sheet 230 contacting the first chip surface 26a of the IC chip 26 and the panel 225 of the cover 212 have high thermal conductivity, the heat generated by the IC chip 26 is dissipated to the panel 225 through the sheet 230. Namely, a heat-radiating path is provided on that side of the IC chip 26 which faces away from the first circuit board 21a. The heat can therefore be radiated from not only the second chip surface 26b of the IC chip 26, but also the first chip surface 26a thereof.

As described above, the first gap 218 is provided between the lower surface 20b of the board 21a and the upper surface 211a of the main body 211, and the second gap 221 is provided between the sides of the projection 220 and the inner surfaces of the opening 205. The air in these gaps 218 and 221 functions as adiabatic layers, preventing the heat from propagating from the projection 220 and the main body 211 into the first circuit board 21a. The heat is not accumulated in the first circuit board 21a. Ultimately, the heat is not transmitted from the TCP 24 to the other components mounted on the board 21a, such as the QFP 23 and the connectors 22. The influence of heat on the other components is therefore reduced to a minimum.

Further, since the first circuit board 21a is clamped between the main body 211 and cover 212 of the radiator 210, the seat surface 217a of the main body 211 contacts the ground wiring layer 202 provided on the lower surface 20b of the first circuit board 21a. Having electrical conductivity, the main body 211 electrically connects the ground wiring layer 202 to the IC chip 26. When the main body 211 is fastened to the board 21a, the IC chip 26 is grounded. No step is required exclusively to connect the IC chip 26 to the ground.

It is difficult to manufacture circuit boards with high dimensional precision. Particularly, the thickness of a circuit board 21a usually differs from the design value. If the main body 211 having the projection 220 is made with sufficiently high precision, the contact surface 220a of the projection 220 inserted in the square opening 205 of the board 21a will protrude or recede from the upper surface 20a of the board 21a. In this case, the carrier 25 supporting the IC chip 26 will be elastically deformed, and the contact surface 220a will become flush with the upper surface 20a of the board 21a. As a result, no excessive force will be exerted on the nodes of the leads 27 and the connection pads 30. The first circuit board 21a and the TCP 24 are reliably connected to each other.

Figure 20:
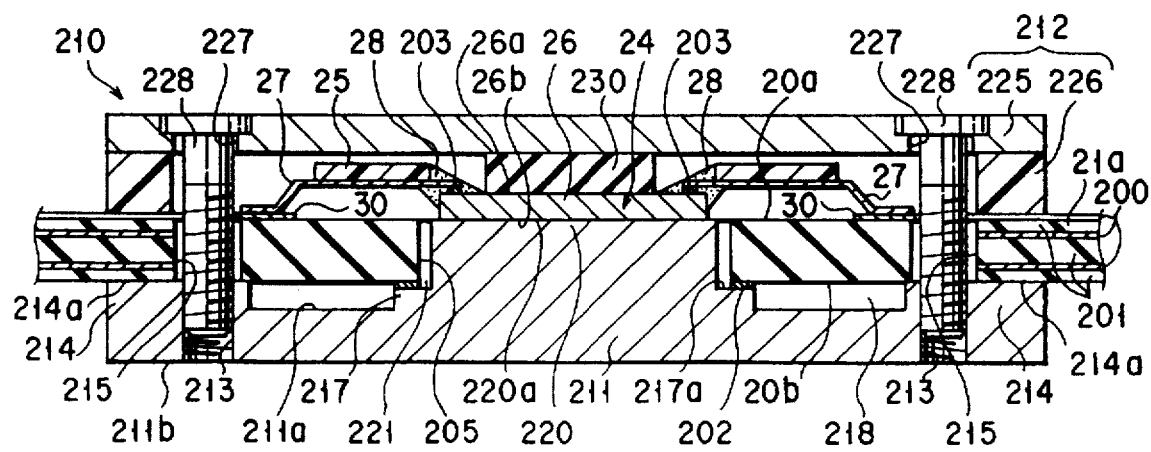
FIG. 20 is a sectional view, showing that part of a portable computer according to a third embodiment, to which a TCP is fastened.

FIG. 20 a sectional view, showing that part of a personal computer according to the third embodiment, to which a TCP 24 is fastened.

The third embodiment is identical to the second embodiment, except that the second chip surface 26b of the IC chip 26 directly contacts the contact surface 220a of the projection 220, with no adhesive layer interposed between the surfaces 26a and 220a. In the third embodiment, too, the IC chip 26 is held between the projection 220 of the radiator 210 and the heat-transmitting sheet 230. That is, there is no gap between the contact surface 220a of the projection 220 and the second chip surface 26b of the IC chip 26. Heat can be efficiently transmitted from the IC chip 26 to the projection 220 and readily dissipated to the main body 211 of the radiator 210.

FIG. 21 is a sectional view, showing that part of a personal computer according to a fourth embodiment, to which a TCP 24 is fastened.

The fourth embodiment is identical to the second embodiment, except that the main body 211 of the radiator 210 has a different structure. To be more specific, the main body 211 has a number of heat-radiating fins 240 on its lower surface 211b. The fins 240 therefore face away from the projection 220 and arranged in the space between the partition wall 90 of the frame 41 and the first circuit board 21a.

Having the fins 240, the radiator 210 has an increased heat-radiating area. In other words, the radiator 210 can radiate heat from the TCP 24 with a higher efficiency.

Figure 23:
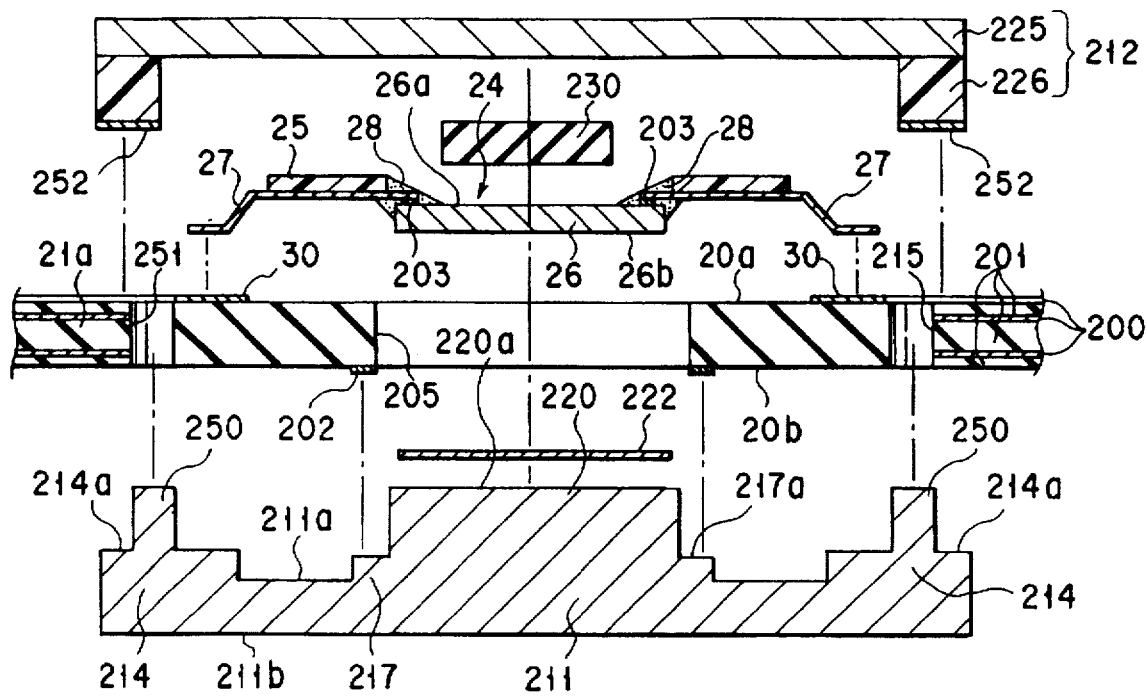
FIG. 23 is an exploded sectional view, showing the circuit board, TCP and radiator of the fifth embodiment.
Figure 24:
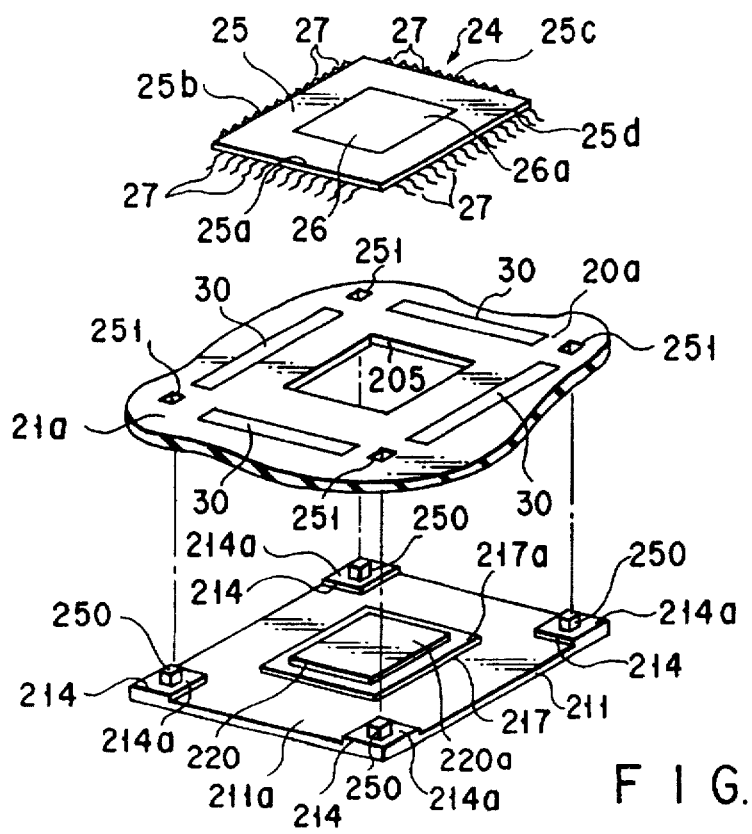
FIG. 24 is an exploded perspective view, showing the circuit board, TCP and radiator of the fifth embodiment.

FIGS. 22, 23 and 24 show a portable computer which is the fifth embodiment of the present invention.

The fifth embodiment differs from the second embodiment only in the structure fastening the radiator 210 to the first circuit board 21a. The components similar or identical to those of the second embodiment are denoted at the same reference numerals in FIGS. 22 to 24 and will not be described in detail in the following description.

As shown in FIGS. 23 and 24, four prism-shaped projections 250 protrudes from the support surfaces 214a of four bosses 214 formed integral with the main body 211. The first circuit board 21a has four holes 251 located around the square opening 205 and between the four connection pads 30. The holes 251 have a polygonal shape identical to the cross section of each prism-shaped projection 250. The projections 250 are force-fitted in the holes 251. The main body 211 of the radiator 210 is thereby fastened to the lower surface 20b of the first circuit board 21a, with the projection 220 inserted in the square opening 205 of the board 21a.

The cover 212 of the radiator 210 is adhered to the upper surface 20a of the first circuit board 21a by an adhesive layer 252. Thus, the main body 211 and the cover 212 are independently secured to the first circuit board 21a and are separated from each other.

Since the main body 211 and cover 212 of the radiator 210 are separated from each other unlike in the second embodiment, the heat generated by the IC chip 26 can be dissipated to both the main body 211 and the cover 212. The heat is radiated from the IC chip 26 more efficiently.

A number of heat-radiating fins 253 may be formed integral with the main body 211, projecting downwards from the lower surface 211b of the main body 211 as indicated by two-dot, one-dash lines in FIG. 22. The cover 212 can be dispensed with, because the main body 211 is held by the first circuit board 21a once its projections 250 has been force-fitted into the holes 251 of the board 21a. Hence, the TCP 24 can be exposed at the upper surface 20a of the first circuit board 21a in some cases.

Figure 25:
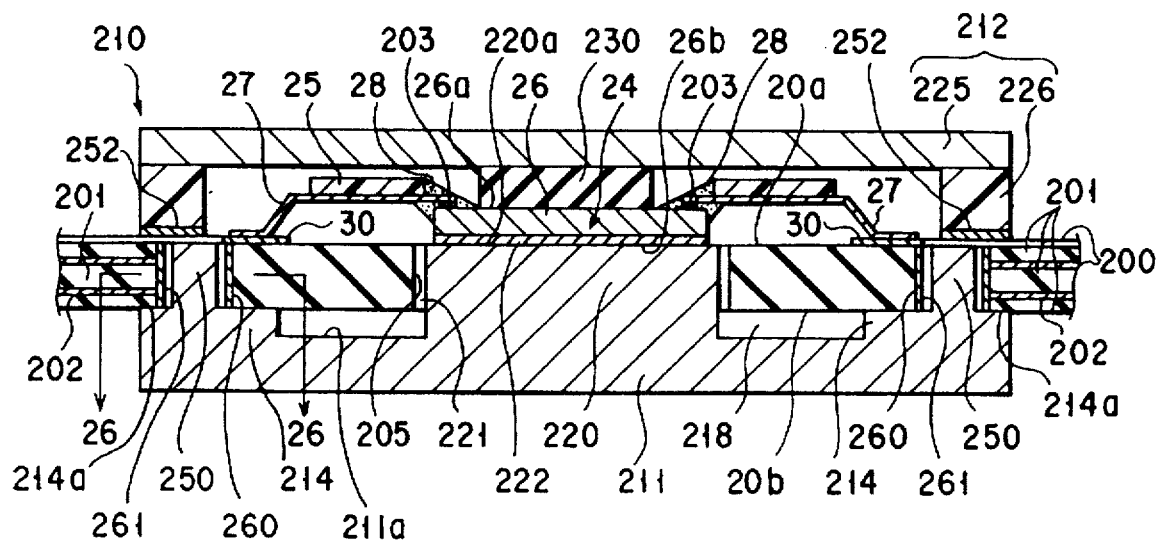
FIG. 25 is a sectional view, showing that part of a portable computer according to a sixth embodiment, to which a TCP is fastened.
Figure 26:
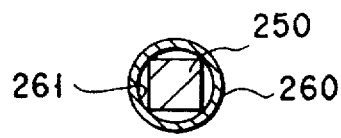
FIG. 26 is a sectional view, taken along line 26—26 in FIG. 25.

FIGS. 25 and 26 show another portable computer which is the sixth embodiment of the invention. More precisely, FIG. 25 is a sectional view showing that part of the computer to which a TCP 24 is fastened, and FIG. 26 is a sectional view, taken along line 26—26 in FIG. 25.

The sixth embodiment is a modification of the fifth embodiment shown in FIGS. 22 to 24. It is characterized in that the ground wiring layer 202 is embedded in the first circuit board 21a—that is, the layer 202 is covered with insulating layers 201. The main body 211 of the radiator 210 has no seat located around the square opening 205. The projection 220 of the radiator 210 is mounted directly on the upper surface 211a of the main body 211.

As shown in FIG. 25, the first circuit board 21a has four circular through holes 260. The prism-shaped projections 250 of the main body 211 are force-fitted in the through holes 260 as shown in FIG. 26. The inner surface of each through hole 260 is covered with an electrically conductive electroplated layer 261. The layers 261 are electrically connected to the ground wiring layer 202.

As shown in FIG. 26, when each prism-shaped projection 250 is force-fitted into the through hole 260 of the main body 211, its four corner edges are set into tight contact with the electroplated layer 261. Thus, the main body 211 of the radiator 210 is connected to the first circuit board 21a, both mechanically and electrically.

In the sixth embodiment, too, the IC chip 26 contacts both the main body 211 of the radiator 210 and the cover 212 thereof. The heat generated by the IC chip 26 can be dissipated to both the main body 211 and the cover 212. The heat is radiated from the IC chip 26 with high efficiently.

The projections 250 of the main body 211, which are electrically conductive, contact the electroplated layers 261 formed on the inner surfaces of the through holes 260 of the first circuit board 21a. Hence, the IC chip 26 is electrically connected to the ground wiring layer 202 by the board 21a and the main body 211. No step is required exclusively to connect the IC chip 26 to the ground.

Figure 27:
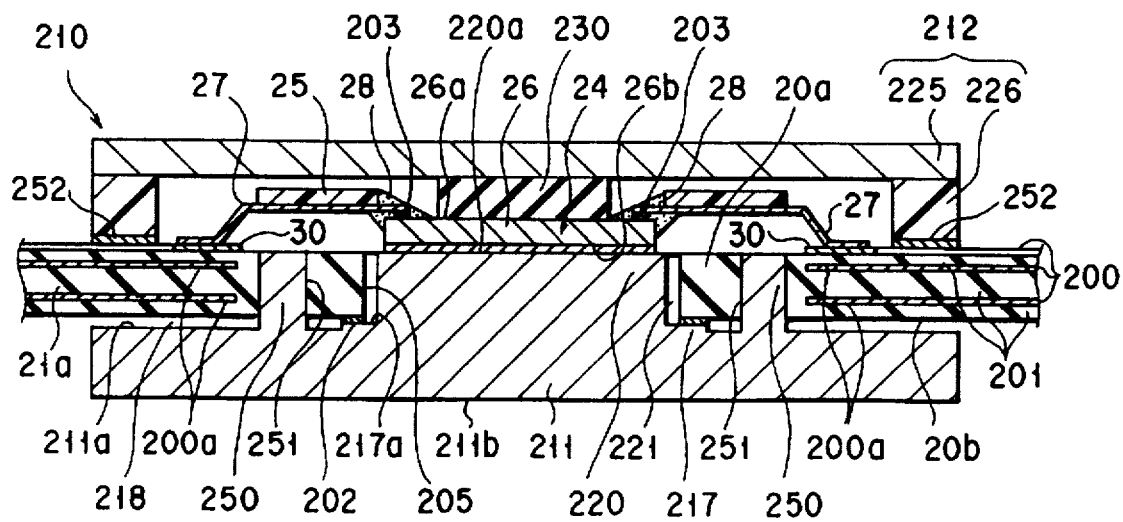
FIG. 27 is a sectional view, showing that part of a portable computer according to a seventh embodiment, to which a TCP is fastened.

FIGS. 27 and 28 show a portable computer which is the seventh embodiment of the present invention. FIG. 27 is a sectional view showing that part of the personal computer, and FIG. 28 is an exploded perspective view showing the first circuit board 21a, the TCP 24, and the radiator 210.

The seventh embodiment is a modification of the sixth embodiment shown in FIGS. 22 to 24. In the seventh embodiment, the prism-shaped projections 250 are located near the projection 220 of the radiator 210. The through holes 251 are made in that part of the first circuit board 21a which lies between the square opening 205 and the connection pads 30. Thus, the projections 250 and the through holes 251 are positioned inside the four sides of the TCP 24. The wiring layers 200 of the board 21a extend longer toward the opening 205 by the distance the holes 251 are shifted toward the opening 205 from the positions which the holes 251 take in the sixth embodiment. Extended parts 200a of the layers 200 are located beneath the connection pads. 30.

No parts of the wiring layers 200 are provided on that part of the board 21a which lies between the square opening 205 and the connection pads 30. The through holes 251 can be made, without the possibility of damaging the wiring layers 200. That is, much care need not be taken to form the holes 251 in the first circuit board 21a.

FIG. 29 shows a portable computer according to the eighth embodiment of this invention. More precisely, it is a sectional view, showing that part of the computer to which a TCP 24 is fastened.

The eighth embodiment is identical to the second embodiment, except for the structure connecting the TCP 24 to the first circuit board 21a.

As shown in FIG. 29, the TCP 24 is mounted on the first circuit board 21a in face-down position, with the first chip surface 26a facing the first circuit board 21a. The first chip surface 26a opposes the contact surface 220a of the projection 220 of the radiator 210. A soft heat-transmitting sheet 270 is interposed between the first chip surface 26a of the IC chip 26 and the contact surface 220a of the projection 220. The sheet 270 is made of rubber-like material, such as a mixture of silicone resin and alumina, and is thermally conductive. Clamped between the projection 220 and the first chip surface 26a of the IC chip 26, the sheet 230 transmits the heat generated by the IC chip 26 to the projection 220. The heat is then transmitted from the projection 220 to the main body 211 of the radiator 210. The second chip surface 26b of the IC chip 26 is adhered to the panel 225 of the cover 212 by an adhesive layer 271. The adhesive layer 271 is an electrically conductive die-attach member which is interposed between the panel 225 of the cover 212 and the second chip surface 26b of the IC chip 26.

Although the TCP 24 is mounted on the first circuit board 21a, assuming a face-down position, the heat generated by the IC chip 26 is dissipated from the first chip surface 26a to the main body 211 through the heat-transmitting sheet 270 and the projection 220. The heat is dissipated also to the panel 225 since the second chip surface 26b of the IC chip 26 is adhered to the panel 225. Namely, the heat is dissipated from both chip surfaces 26a and 26b of the IC chip 26. The heat generated by the IC chip 26 can be radiated more effectively.

FIG. 30 illustrates a portable computer according to the ninth embodiment of the invention. To be more specific, FIG. 30 is a sectional view showing that part of the computer to which a TCP 24 is fastened.

The ninth embodiment is identical to the second embodiment, except for the structure for dissipating the heat from the IC chip 26 incorporated in the TCP 24.

As shown in FIG. 30, a heat-radiating member 280 is set in the square opening 205 of the first circuit board 21a. The member 280 is made of a metallic material having high thermal conductivity, such as aluminum alloy. The heat-radiating member 280 is a square plate as thick as the first circuit board 21a. It is held steadfast by adhesive 281 filling the gap between the inner surfaces of the opening 205 and the sides of the member 280. The adhesive 281 is electrically non-conductive and has a high thermal resistance. The heat-radiating member 280 is electrically insulated from the first circuit board 21a, though firmly adhered to the board 21a.

The heat-radiating member 280 has two flat surfaces, i.e., a contact surface 280a and a heat-radiating surface 280b. The contact surface 280a is contiguous to and flush with the upper surface 20a of the first circuit board 21a. The heat-radiating surface 280b is contiguous to and flush with the lower surface 20b of the first circuit board 21a. The phrase "flush with" does not necessarily mean that the contact surface 280a and the upper surface 20a are in an identical plane, or that the heat-radiating surface 280b and the lower surface 20b are in an identical plane. Rather, it means that the surfaces 280a and 280b may be rough, having small projections and small recesses. The contact surface 280a is larger than the second chip surface 26b of the IC chip 26. Interposed between the contact surface 280a and the second chip surface 26b is an adhesive layer 282, which fastens the heat-radiating member 280 and the IC chip 26 together.

A ground wiring layer 202 is provided on the lower surface 20b of the first circuit board 21a. The lower surface 20b is covered with a solder layer 283 which is electrically conductive. The solder layer 283 covers the heat-radiating surface 280b of the member 280, as well. That portion of the solder layer 283 which covers the lower surface 20a of the board 21a contacts the heat-receiving surface 136 of the frame 41.

The solder layer 283 covering the lower surface 20b of the board 21a and the heat-radiating surface 280b of the member 280 has been formed in the following method. First, the heat-radiating member 280 is fitted in the square opening 205 of the first circuit board 21a. Next, solder paste is coated on the lower surface 20b and the heat-radiating surface 280b. The first circuit board 21a is then heated, melting the solder paste coated on the lower surface 20b and the heat-radiating surface 280b. Thereafter, the board 21a is cooled, hardening the solder and forming a thin solder layer 283 which covers both the lower surface 20b and the heat-radiating surface 280b. The solder layer 283, thus formed, has a flat and smooth surface. Formed on the lower surface 20b and the heat-radiating surface 280b, the solder layer 283 electrically connects the ground wiring layer 202 to the heat-radiating member 280.

The heat generated by the IC chip 26 is transmitted from the entire surface of the second chip surface 26b of the IC chip 26 to the heat-radiating member 280 through the adhesive layer 282. The heat is radiated from the surface 280b to the frame 41. As a result, the heat is efficiently dissipated from the frame 41.

That surface of the solder layer 283 which contacts the heat-receiving surface 136 of the frame 41 is flat and smooth. No gap is formed between the solder layer 283 and the heat-receiving surface 136 to retard the propagation of heat from the heat-radiating member 280 to the frame 41. Hence, the heat transmitted to the member 280 can be efficiently dissipated to the frame 41.

As indicated above, the solder layer 283 electrically connects the ground wiring layer 202 to the heat-radiating member 280. The member 280 can be used as part of a grounding circuit. No step is required exclusively to connect the IC chip 26 to the ground.

Having a high thermal resistance, the adhesive 281 filling the gap between the inner surfaces of the opening 205 and the sides of the member 280 function as an adiabatic layer, preventing the transmission of heat from the member 280 to the first circuit board 21a. This serves to prevent excessive heating of the first circuit board 21a. Heat is not transmitted from the TCP 24 to the other components mounted on the board 21a, such as the QFP 23 and the connectors 22. The influence of heat on the other components is therefore reduced to a minimum.

In the ninth embodiment, a cover may be adhered to the upper surface 20a of the first circuit board 21a and may cover the TCP 24, as in the fifth embodiment shown in FIGS. 22 to 24.

FIGS. 31 to 34 illustrate a portable computer according to the tenth embodiment of the present invention. The tenth embodiment is identical to the second embodiment, except for the structure connecting a TCP 24 to a first circuit board 21a and the path of dissipating heat from the TCP 24. The components similar or identical to those of the second embodiment are denoted at the same reference numerals in FIGS. 31 to 34 and will not be described in detail in the following description.

As shown in FIG. 31, the TCP 24 is mounted on the first circuit board 21a in face-down position, with the first chip surface 26a facing the first circuit board 21a. Leads 27 contact the first chip surface 26a of the IC chip 26 provided in the TCP 24. The IC chip 26 is mounted on the upper surface 20a of the first circuit board 21a. Namely, the upper surface 20a is the chip-mounting surface. The second chip surface 26b of the IC chip 26 faces away from the upper surface 20a of the first circuit board 21a. A gap 300 is provided between the upper surface 20a of the board 21a and the first chip surface 26a of the IC chip 26.

The first circuit board 21a comprises an insulating layer 201 and a ground wiring layer 202 embedded the layer 201. As shown in FIG. 31, the ground wiring layer 201 is located outside that part of the board 21a on which the TCP 24 is mounted. That part of the board 21a is therefore comprised of the insulating layer 202 only.

A heat-radiating member 301 is fastened to that part of the board 21a on which the TCP 24 is mounted. The member 301 is made of a metallic material having high thermal conductivity and electrical conductivity, such as aluminum alloy. The member 301 comprises a panel 302 and a rim 303. The panel 302 is a substantially square plate larger than the TCP 24. The rim 303 is formed integral with the panel 302 and protrude downwards from the four edges of the panel 302. The rim 303 is located outside that part of the board 21a on which the TCP 24 is mounted. Its lower surface contacts the upper surface 20a of the first circuit board 21a.

As shown in FIG. 32, the panel 302 has four screw holes 305 in the four corners, respectively. The screw holes 305 are axially aligned with the four holes 215 made in the first circuit board 21a. Four screws 306 are inserted in the holes 215 from the side facing away from the heat-radiating member 301. The screws 306 are driven into the screw holes 305 of the panel 302. The heat-radiating member 301 is thereby secured to the upper surface 20a of the first circuit board 21a, covering the TCP 24 and the nodes of the leads 27 and the connection pads 30.

The lower surface of the panel 302 of the member 301 opposes the second chip surface 26b of the IC chip 26. An adhesive layer 307 is interposed between the second chip surface 26b and the panel 302. The adhesive layer 271, which is an electrically conductive die-attach member, adheres the IC chip 26 to the panel 302 of the heat-radiating member 301.

As seen from FIG. 31, an electrically conductive layer 308 is arranged on the upper surface 20a of the first circuit board 21a and located outside that part of the board 21a on which the TCP 24 is mounted. The layer 308 contacts the lower surface of the rim 303 of the heat-radiating member 301 once the member 301 is secured to the upper surface 20a of the first circuit board 21a. The electrically conductive layer 308 is located above the ground wiring layer 202. The layer 308 is electrically connect to the ground wiring layer 202 by electrically conductive pins 309. The pins 309 penetrate the board 21a and the ground wiring layer 202 and contact the layer 308 at their upper ends. Thus, once the heat-radiating member 301 is secured by the screws 306 to the upper surface 20a of the board 21a, the rim 303 of the member 301 is electrically connected to the ground wiring layer 202 by the electrically conductive layer 308 and the electrically conductive pins 309. Hence, when the first circuit board 21a is fastened to the heat-radiating member 301, the IC chip 26 is automatically connected to the ground wiring layer 202. No step is required exclusively to connect the IC chip 26 to the ground.

The first circuit board 21a has a square opening 310 in its part on which the TCP 24 is mounted. The opening 310 faces the first chip surface 26a of the IC chip 26. A gap 300 is provided between the upper surface 20a of the board 21a and the first chip surface 26a of the IC chip 26.

Since the TCP 24 is mounted on the first circuit board 21a in face-down position, the IC chip 26 cannot be supported by the board 21a due to the provision of the gap 300. The TCP 24 needs to be pressed onto the panel 302 of the member 301 by a holder 311 as shown in FIGS. 33 and 34 until the adhesive layer 307 hardens sufficiently. The holder 311 comprises a main body 311a and a guide section 311b. The main body 311a is interposed between the upper surface 20a of the board 21a and the first chip surface 26a of the IC chip 26. The guide section 311b passes trough the square opening 310 and extends outwards from the lower surface 20b of the board 21a. The holder 311 is made of, for example, rubber-like elastic material and can therefore be deformed elastically.

The square opening 310 of the board 21a is slightly smaller than the main body 311a of the holder 311. The holder 311 is removed through the opening 310 from the space between the board 21a and the IC chip 26 after the adhesive layer 307 has hardened. More specifically, the holder 311 is held at the lower end of the guide section 311b, which protrudes from the lower surface 20b of the board 21a, and then pulled downwards. As the holder 311 is pulled, the main body 311a is first deformed, then pulled into the opening 310, and finally pulled out of the opening 310. After the holder 311 has been thus removed from said space, the IC chip 26 remains adhered to the lower surface of the panel 302 by the adhesive layer 307.

How the TCP 24 is mounted on and secured to the first circuit board 21a will now be explained.

First, as shown in FIG. 33, the holder 311 is inserted into the opening 310 of the board 21a from above, until the main body 311a abuts on the upper surface 20a of the board 21a.

Then, the TCP 24 is mounted on the first circuit board 21a, with the IC chip 26 set in face-down position. Namely, the IC chip 26 is so positioned that the first chip surface 26a of the IC chip 26 opposing the first circuit board 21a and that the leads 27 contacting the first chip surface 26a. The leads 27 are soldered, at their distal ends, to the connection pads 30, whereby the first chip surface 26a of the IC chip 26 comes into contact with the main body 311a of the holder 311. Thus, the holder 311 supports the IC chip 26 from below.

Next, the adhesive layer 307 is coated on the second chip surface 26b of the IC chip 26. The heat-radiating member 301 is mounted on the upper surface 20a of the first circuit board 21a, covering the TCP 24 and the nodes of the leads 27 and the connection pads 30. The screws 306 are inserted into the holes 215 of the board 21a and driven into the screw holes 305 of the panel 302, fastening the heat-radiating member 301 to the first circuit board 21a. The IC chip 26 is thereby clamped between the panel 302 of the member 301 and the holder 311. Then, the gap between the second chip surface 26b of the IC chip 26 and the lower surface of the panel 302 is filled with adhesive 307. The IC chip 26 is biased toward the panel 302 thanks to the elasticity the holder 311 has. Therefore, the IC chip 26 would neither hang from the panel 302 nor move off the panel 302 until the adhesive layer 307 hardens. The IC chip 26 is thereby held in the same position.

When the adhesive layer 307 hardens, securing the IC chip 26 to the panel 302, the holder 311 is held at the lower end of its guide section 311b and pulled downwards. The main body 311a is thereby deformed, then pulled into the opening 310 and out of the opening 310, from the lower surface 21 of the first circuit board 21a. The holder 311 is thus removed from the space between the board 21a and the IC chip 26.

The heat the IC chip 26 generates while operating is dissipated from the second chip surface 26b of the IC chip 26, which faces away from the first circuit board 21a. Since the adhesive layer 307 is interposed between the second chip surface 26a of the IC chip 26 and the lower surface of the panel 302, no gap is formed between the IC chip 26 and the panel 302 to hinder the transmission of heat from the IC chip 26 to the panel 302. The heat can be dissipated to the heat-radiating member 301 with high efficiency. Although the TCP 24 is mounted on the first circuit board 21a, assuming a face-down position, a heat-radiating path is provided on that side of the IC chip 26 which faces away from the first circuit board 21a. The heat generated by the IC chip 26 can be radiated without using the first circuit board 21a.

After the holder 311 has been removed from the space between the board 21a and the IC chip 26, the gap 300 is provided between the board 21a and the IC chip 26. This gap 300 functions as an adiabatic layer, preventing the radiation of heat from the IC chip 26 to the first circuit board 21a. As a result, the influence of heat on the other components mounted on the first circuit board 21a is reduced to a minimum.

Once the holder 311 has been removed, the opening 310 communicates with the gap 300 and faces the first chip surface 26a of the IC chip 26. This makes it possible to dissipate the heat radiating from the IC chip 26 into a space outside the board 21a through the opening 310. The heat would not accumulate in the space between the board 21a and the heat-radiating member 301. This also helps to minimize the influence of heat on the other components mounted on the first circuit board 21a.

Biased by the holder 311 onto the panel 302 of the heat-radiating member 301 until the adhesive layer 307 hardens, the IC chip 26 remains in the same position. It is therefore reliably adhered, at its second chip surface 26b, to the lower surface of the panel 302. This serves to promote the transmission of heat from the IC chip 26 to the panel 302.

FIG. 35 shows a portable computer which is the eleventh embodiment of the present invention. To state more precisely, it is a sectional view showing that part of the computer to which a TCP 24 is fastened.

The eleventh embodiment is a modification of the tenth embodiment shown in FIGS. 31 to 34. It differs from the tenth embodiment in respect of the shape of the heat-radiating member 301.

As shown in FIG. 35, the heat-radiating member 301 has a number of heat-radiating fins 320 formed integral with the panel 302. The fins 320 project from the upper surface of that part of the panel 302 which contacts the IC chip 26. Having the fins 320, the panel 302 has an increased heat-radiating area. Thus, the panel 302 can radiate heat from the TCP 24 with a higher efficiency than its counterpart incorporated in the tenth embodiment. The fins 320 serve to dissipate the heat from the TCP 24 more effectively.

Figure 38:
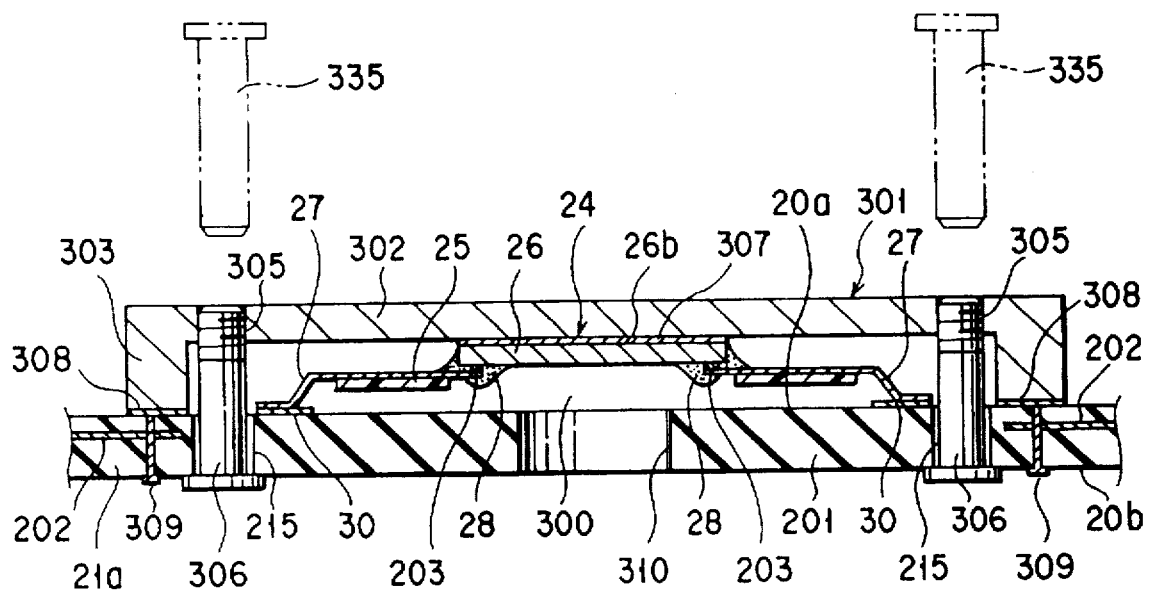
FIG. 38 is a sectional view of a part of the twelfth embodiment, illustrating the holding member removed from the through hole of the circuit board.

FIGS. 36, 37 and 38 illustrate another portable computer according to the twelfth embodiment of the present invention. More specifically, FIG. 36 shows that part of the computer to which a TCP 24 is secured, FIG. 37 shows an IC chip 26 of the TCP 24 pressed onto a holder 330 contacting a heat-radiating member 301, and FIG. 38 shows holder 330 removed from the through hole 310 of the first circuit board 21a.

The twelfth embodiment is identical to the tenth embodiment, except for the structure for biasing the TCP 24 onto the member 301 until an adhesive layer 307 hardens.

As shown in FIGS. 36 and 37, a holder 330 is removably attached to the lower surface 20b of the first circuit board 21a, biasing the TCP 24 onto the member 301 until an adhesive layer 307 hardens. The holder 330 comprises a base 331 and a projection 332. The base 331 is a flat square plate contacting the lower surface 20b of the board 21a. It base 331 has a plurality of screw holes 333 axially aligned with the through holes 215 of the first circuit board 21a. The projection 332 is formed integral with the base 331 and inserted in the square opening 310 of the board 21a and contacts the second chip surface 26b of the IC chip 26 at its flat contact surface 332a.

The holder 330 is attached to the first circuit bard 21a, along with the heat-radiating member 301, by means of screws 335 for use in provisional fastening. The screws 335 pass through the screw holes 305 of the heat-radiating member 301 and the holes 215 of the first circuit board 21a and driven into the screw holes 333 of the base 331, thus clamping the board 21a between the member 301 and the holder 330. In other words, the board 21a, the member 301 and the holder 330 are fastened together. The projection 332 of the holder 330 protrudes from the upper surface 20a of the board 21a, with its contact surface 332a contacting the first chip surface 26a of the IC chip 26. The projection 332 biases the IC chip 26 onto the panel 302 of the heat-radiating member 301.

It will now be explained how the TCP 24 is mounted on and secured to the first circuit board 21a in the twelfth embodiment.

First, the TCP 24 is mounted on the upper surface 20a of the first circuit board 21a, in a face-down position. The leads 27 of the TCP 24 are soldered to the connection pads 30 provided on the upper surface 20a of the board 21a.

Next, an adhesive layer 307 is coated on the second chip surface 26b of the IC chip 26. The heat-radiating member 301 is placed on the upper surface 20a of the board 21a. Further, the holder 330 is mounted on the lower surface 20b of the board 21a, with its base 331 contacting the lower surface 20b. The screws 335 are inserted into the screw holes 305 of the member 301 and the holes 215 of the board 21a and driven into the screw holes 333 of the base 331. The member 301 is provisionally fastened to the board 21a. At the same time, the holder 330 is attached to the board 21a, whereby the contact surface 332a of the projection 332 is set in contact with the second chip surface 26b of the IC chip 26. The holder 330 pushes the IC chip 26 onto the panel 302, with the adhesive layer 307 interposed between the second chip surface 26b of the IC chip 26 and the lower surface of the panel 302. Namely, the IC chip 26 is clamped between the panel 302 and the holder 330. The IC chip 26 would neither hang from the panel 302 nor move off the panel 302 until the adhesive layer 307 hardens.

After the adhesive layer 307 hardens, firmly fixing the IC chip 26 to the panel 302, the screws 335 are loosened and pulled from the board 21a and the member 301, thereby removing the holder 330 from the first circuit board 21a. Screws 306 are then inserted into the holes 215 of the board 21a and driven into the screw holes 305 of the heat-radiating member 301. The member 301 is thereby fastened to the first circuit board 21a. The IC chip 26 hangs from the lower surface of the panel 302, adhered to thereto by the adhesive layer 307.

Biased by the holder 330 onto the panel 302 of the heat-radiating member 301 until the adhesive layer 307 hardens, the IC chip 26 remains in the same position. It is therefore reliably adhered, at its second chip surface 26b, to the lower surface of the panel 302. This does serve to promote the transmission of heat from the IC chip 26 to the heat-radiating member 301.

Figure 39:
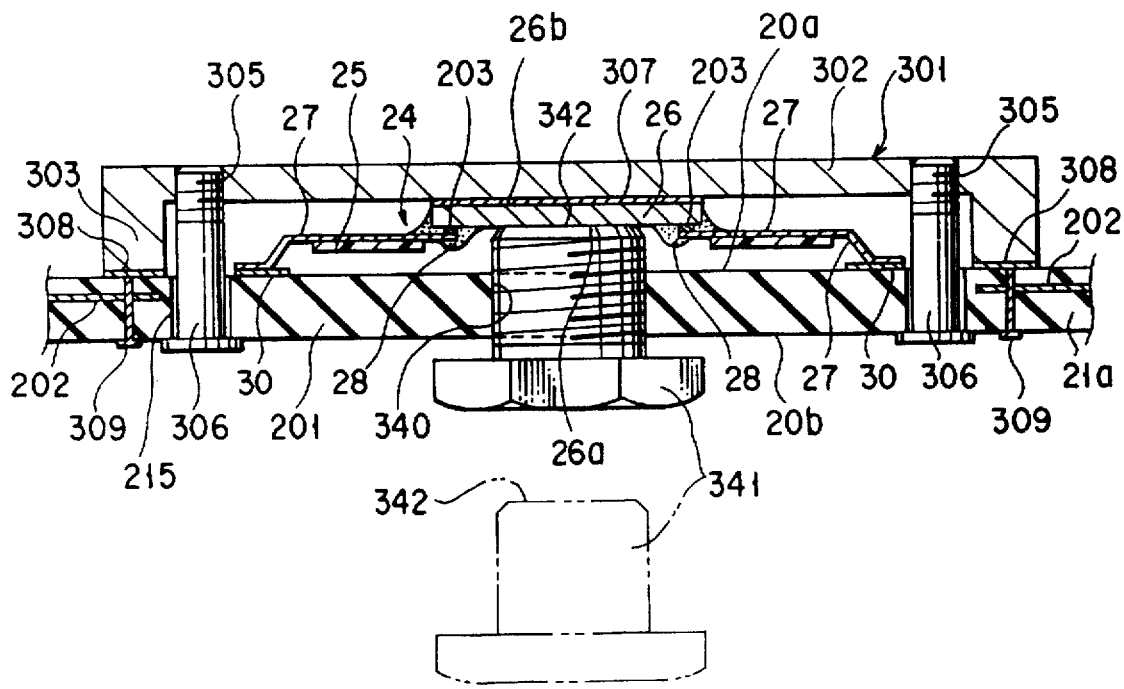
FIG. 39 is a sectional view, showing that part of a portable computer according to a thirteenth embodiment, to which a TCP is fastened.

FIG. 39 illustrates a portable computer which is the thirteen embodiment of the present invention. More precisely, it shows that part of this portable computer to which a TCP 24 is fastened.

As shown in FIG. 39, the first circuit board 21a has a screw hole 340 made in that part on which the TCP 24 is mounted. The screw hole 340 faces the IC chip 26. A gap 300 is provided between the board 21a and the IC chip 26 incorporated in the TCP 24. A screw 341 is driven the screw hole 340, from the lower surface 20b of the board 21a, holding the IC chip 26.

The screw 341 extends into the gap 300 between the board 21a and the IC chip 26. It has a flat distal-end face 342, which contacts the first chip surface 26a of the IC chip 26. The screw 341 biases the IC chip 26 onto the panel 302 of the heat-radiating member 301. Namely, the IC chip 26 is clamped between the panel 302 and the screw 341. The screw 341 holds the IC chip 26 in this state, and the IC chip 26 would neither hang from the panel 302 nor move off the panel 302 until the adhesive layer 307 hardens.

After the adhesive layer 307 hardens, firmly fixing the IC chip 26 to the panel 302, the screws 341 is loosened and pulled from the board 21a. Then, the gap 300 between the board 21a and the IC chip 26 is opened to the outside through the screw hole 340. Thereafter, the heat radiating from the IC chip 26 is dissipated outside the board 21a through the screw hole 340.

In all embodiments described above, the leads are connected to the bumps provided on the first surface of the IC chip. The present invention is not limited to these embodiment, nonetheless. The connection pads on the circuit board may be connected to the bumps by wiring bonding.

Needless to say, the structure for dissipating heat from circuit modules, according to this invention, may be used not only portable computers, but also in other electronic apparatuses and various fields of technology.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A portable computer comprising:

a portable computer body containing a metal frame, data-inputting means and means for processing data received by said data-inputting means;

a circuit board supported by said metal frame;

an IC chip mounted on said circuit board and generating heat while operating said metal frame having a heat-receiving part receiving heat generated by said IC chip; and a heat pipe supported by said metal frame and thermally connected to said heat-receiving part of said metal frame, for dissipating heat transmitted from said IC chip to said heat-receiving part.

2. The portable computer according to claim 1, wherein said metal frame has a heat-radiating part located remote from said heat-receiving part, and said heat pipe has a first end and a second end coupled to said heat-receiving part and said heat-radiating part, respectively.

3. The portable computer according to claim 2, wherein the heat-radiating part of said metal frame has a number of fins.

4. The portable computer according to claim 1, wherein said circuit board has a first surface and a second surface facing away from the first surface and facing said heat-receiving part, and said IC chip is mounted on said first surface.

5. The portable computer according to claim 4, wherein said circuit board has a number of through holes in that part on which said IC chip is mounted, and each of said through holes has a first end and a second end which open to the first and second surfaces of said circuit board, respectively.

6. The portable computer according to claim 1, further comprising a metal cover supported by said circuit board and covering said IC chip.

7. The portable computer according to claim 5, further comprising a thermally conductive soft member interposed between the second surface of said circuit board and the heat-receiving part of said metal frame.

8. The portable computer according to claim 5, wherein said IC chip has a number of leads, a number of pads are provided on the first surface of said circuit board and connected to said leads, and a chip cover covers junctions between said leads and said pads.

9. The portable computer according to claim 1, wherein said body has a housing supported by said metal frame and covering said metal frame.

10. A portable computer comprising:

a body containing a metal frame, data-inputting means and means for processing data received by said data-inputting means;

a circuit board supported by said metal frame and having a first surface and a second surface facing away from the first surface; and an IC chip mounted on the first surface of said circuit board and generating heat while operating, wherein said metal frame has a heat-receiving part contacting the second surface of said circuit board, for receiving heat from said IC chip through said circuit board, and a heat pipe supported by said metal frame, and said heat pipe is designed to dissipate heat transmitted from said IC chip to said heat receiving part.

11. The portable computer according to claim 10, wherein said metal frame has a heat-radiating part located remote from said heat-receiving part, and said heat pipe has a first end and a second end coupled to said heat-receiving part and said heat-radiating part, respectively.

12. The portable computer according to claim 10, wherein said body has a housing supported by said metal frame and covering said metal frame.

13. A portable computer comprising:

a housing having an upper surface;

a keyboard mounted on the upper surface of said housing;

a metal frame fixed in place within said housing;

a circuit board supported by said metal frame;

an IC chip mounted on said circuit board and generating heat while operating, said metal frame having a heat-receiving part receiving heat generated by said IC chip; and a heat pipe supported by said metal frame and thermally connected to said heat-receiving part of said metal frame, for dissipating heat transmitted from said IC chip to said heat-receiving part.

14. The portable computer according to claim 13, wherein said metal frame has a heat-radiating part located remote from said heat-receiving part, and said heat pipe has a first end and a second end coupled to said heat-receiving part and said heat-radiating part, respectively.

15. The portable computer according to claim 14, wherein the heat-radiating part of said metal frame has a number of fins.

* * * * *

UNITED STATES PATENT AND TRADEMARK OFFICE
CERTIFICATE OF CORRECTION

PATENT NO. : 5,784,256
DATED : July 21, 1998
INVENTOR(S) : Nakamura, et. al.

It is certified that error appears in the above-identified patent and that said Letters Patent is hereby corrected as shown below:

Title page, item [30] Foreign Application Priority Data, delete

"Sep. 14, 1994 [JP] Japan ................6-310848

May 25, 1995 [JP] Japan ................7-126461"

Signed and Sealed this

Ninth Day of February, 1999

Attest:

Attesting Officer

Acting Commissioner of Patents and Trademarks